(12) United States Patent
Abbott et al.

(10) Patent No.: US 11,658,688 B2
(45) Date of Patent: May 23, 2023

(54) MULTIPLEXER WITH BULK ACOUSTIC WAVE FILTER AND MULTILAYER PIEZOELECTRIC SUBSTRATE FILTER

(71) Applicant: Skyworks Solutions, Inc., Irvine, CA (US)

(72) Inventors: Benjamin Paul Abbott, Irvine, CA (US); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 21 days.

(21) Appl. No.: 16/863,030

(22) Filed: Apr. 30, 2020

(65) Prior Publication Data

US 2020/0358464 A1 Nov. 12, 2020

Related U.S. Application Data

(60) Provisional application No. 62/841,663, filed on May 1, 2019, provisional application No. 62/841,647, filed on May 1, 2019.

(51) Int. Cl.
*H03H 9/64* (2006.01)
*H03H 9/70* (2006.01)
*H03H 9/02* (2006.01)
*H04B 1/00* (2006.01)
*H03H 9/25* (2006.01)

(52) U.S. Cl.
CPC ....... *H04B 1/0057* (2013.01); *H03H 9/02574* (2013.01); *H03H 9/25* (2013.01); *H03H 9/6406* (2013.01); *H03H 9/706* (2013.01)

(58) Field of Classification Search
CPC .......... H04B 1/0057; H03H 9/02; H03H 9/25; H03H 9/54; H03H 9/64; H03H 9/70–725
See application file for complete search history.

(56) References Cited

U.S. PATENT DOCUMENTS

| | | | | |
|---|---|---|---|---|
| 6,766,149 | B1 * | 7/2004 | Hikita | H03H 9/725 343/702 |
| 9,240,622 | B2 | 1/2016 | Schmidhammer et al. | |
| 9,391,587 | B2 | 7/2016 | Schmidhammer | |
| 9,628,048 | B2 | 4/2017 | Nam et al. | |
| 9,837,214 | B2 * | 12/2017 | Link | H01G 4/38 |
| 10,141,913 | B2 * | 11/2018 | Takamine | H03H 9/0576 |

(Continued)

OTHER PUBLICATIONS

Moorhead, P., "Qualcomm Raises Wireless Stakes With Full 5G Modules and More RF Offerings," Feb. 27, 2018.

(Continued)

*Primary Examiner* — Hafizur Rahman
*Assistant Examiner* — Alan Wong
(74) *Attorney, Agent, or Firm* — Knobbe, Martens, Olson & Bear, LLP

(57) ABSTRACT

Embodiments of this disclosure relate to multiplexers that include acoustic wave filters for filtering radio frequency signals. In certain embodiments, a multiplexer includes a first acoustic wave filter including bulk acoustic wave resonators and a second acoustic wave filter including multilayer piezoelectric substrate surface acoustic wave resonators. The second acoustic wave filter can have a second pass band that is above a first pass band of the first acoustic wave filter. Related acoustic filter assemblies, packaged radio frequency modules, wireless communication devices, and methods are disclosed.

20 Claims, 19 Drawing Sheets

(56) References Cited

U.S. PATENT DOCUMENTS

| | | | |
|---|---|---|---|
| 10,367,475 B2 | 7/2019 | Caron | |
| 10,541,673 B2 | 1/2020 | Caron | |
| 10,778,180 B2 * | 9/2020 | Tajic | H03H 9/02157 |
| 10,826,543 B2 * | 11/2020 | Ella | H04B 1/006 |
| 2007/0296521 A1 | 12/2007 | Schmidhammer | |
| 2021/0119650 A1 | 4/2021 | Abbott et al. | |

OTHER PUBLICATIONS

LTE CA Spectrum, available at: http://niviuk.free.fr/lte_ca_spectrum.php (accessed Aug. 8, 2019).

Tirado, Jordi Verdu, "Bulk Acoustic Wave Resonators and their Application to Microwave Devices," Ph.D. Dissertation, University of Barcelona, Jun. 2010.

Mueller, W. et al., "Multiplexers as a Method of Supporting Same-Frequency-Range Down Link Carrier Aggregation," 2016 IEEE MTT-S International Microwave Symposium (IMS), San Francisco, CA, 2016, pp. 1-4.

Takai, et al., "Investigations on design technologies for SAW quadplexer with narrow duplex gap," 2016 IEEE MTT-S International Microwave Symposium (IMS), San Francisco, CA, 2016, pp. 1-4.

Pitschi, F. Maximilian, et al., "High Performance Microwave Acoustic Components for Mobile Radios," 2009.

Nishihara, Tokihiro, et al., "BAW/SAW/IPD hybrid type duplexer with Rx balanced output for WCDMA Band I," 2008 IEEE MTT-S International Microwave Symposium Digest, Atlanta, GA, USA, 2008, pp. 831-834.

* cited by examiner

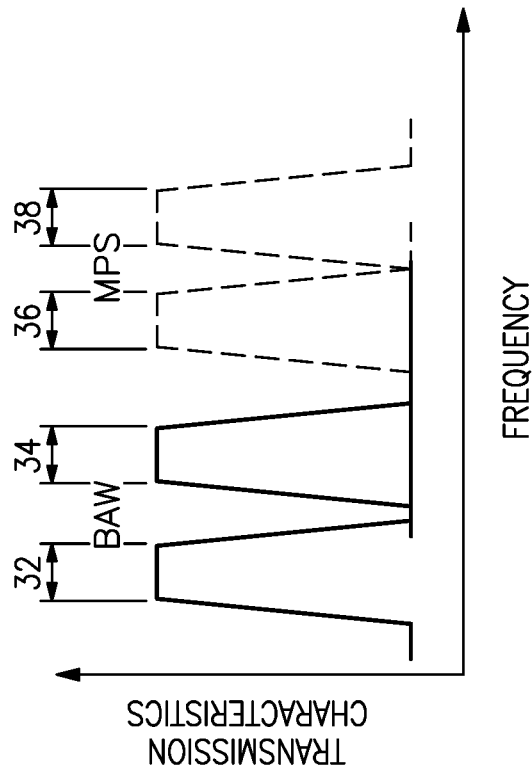
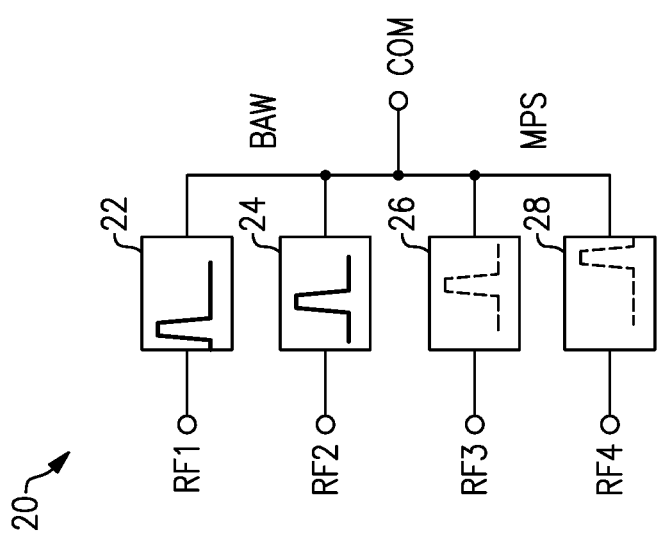

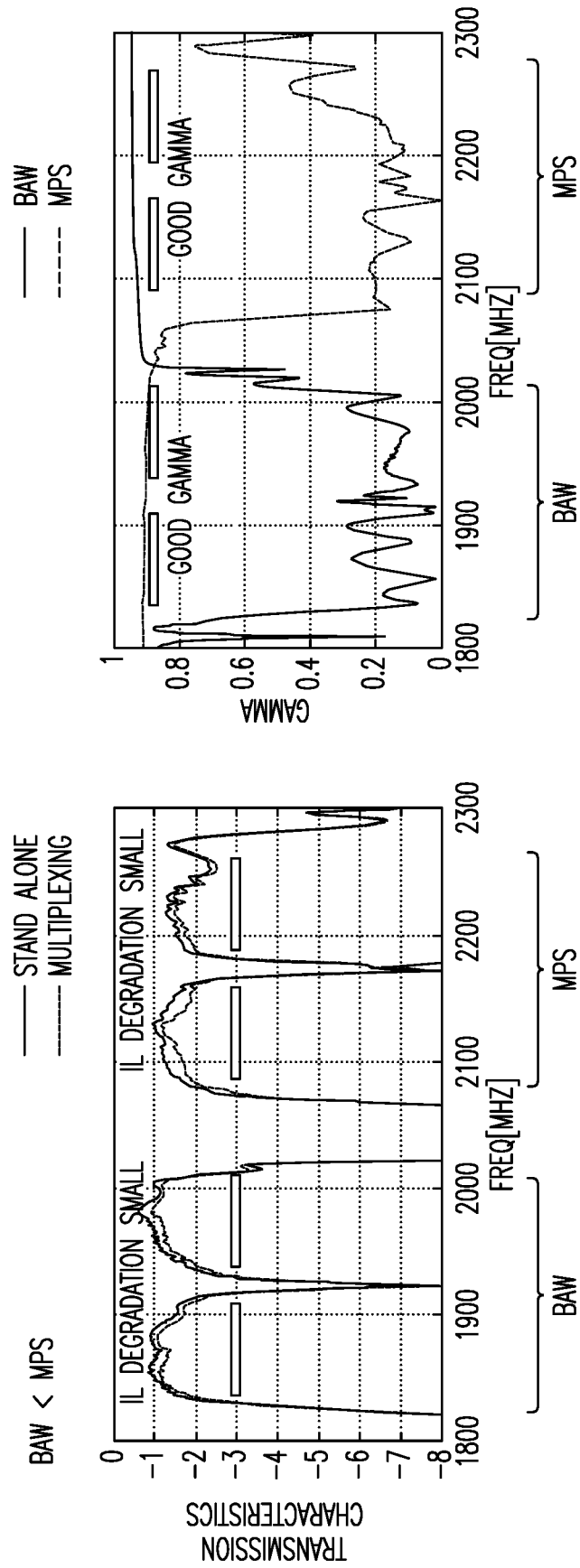

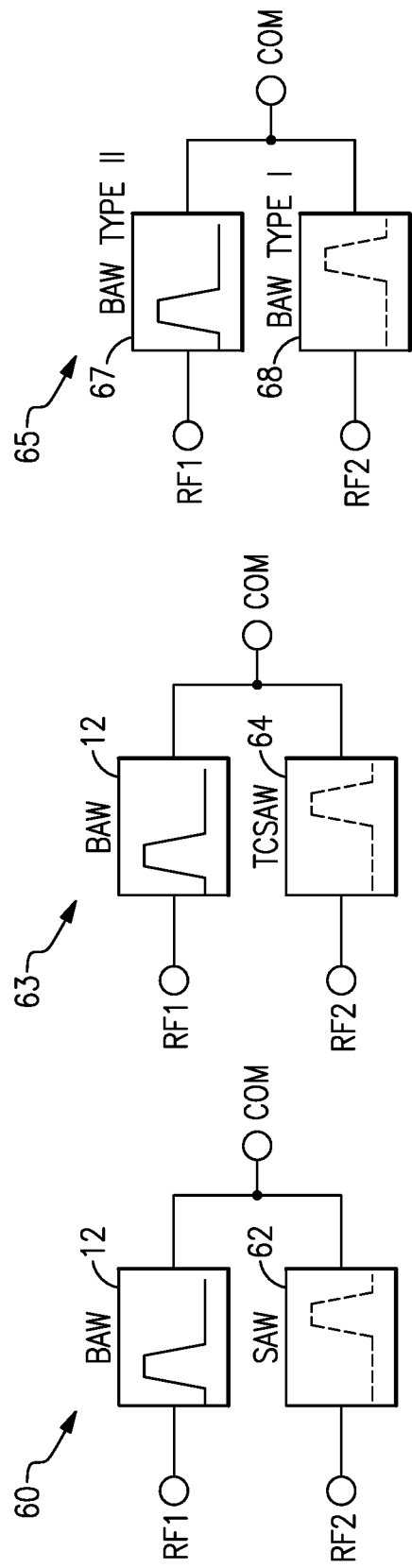

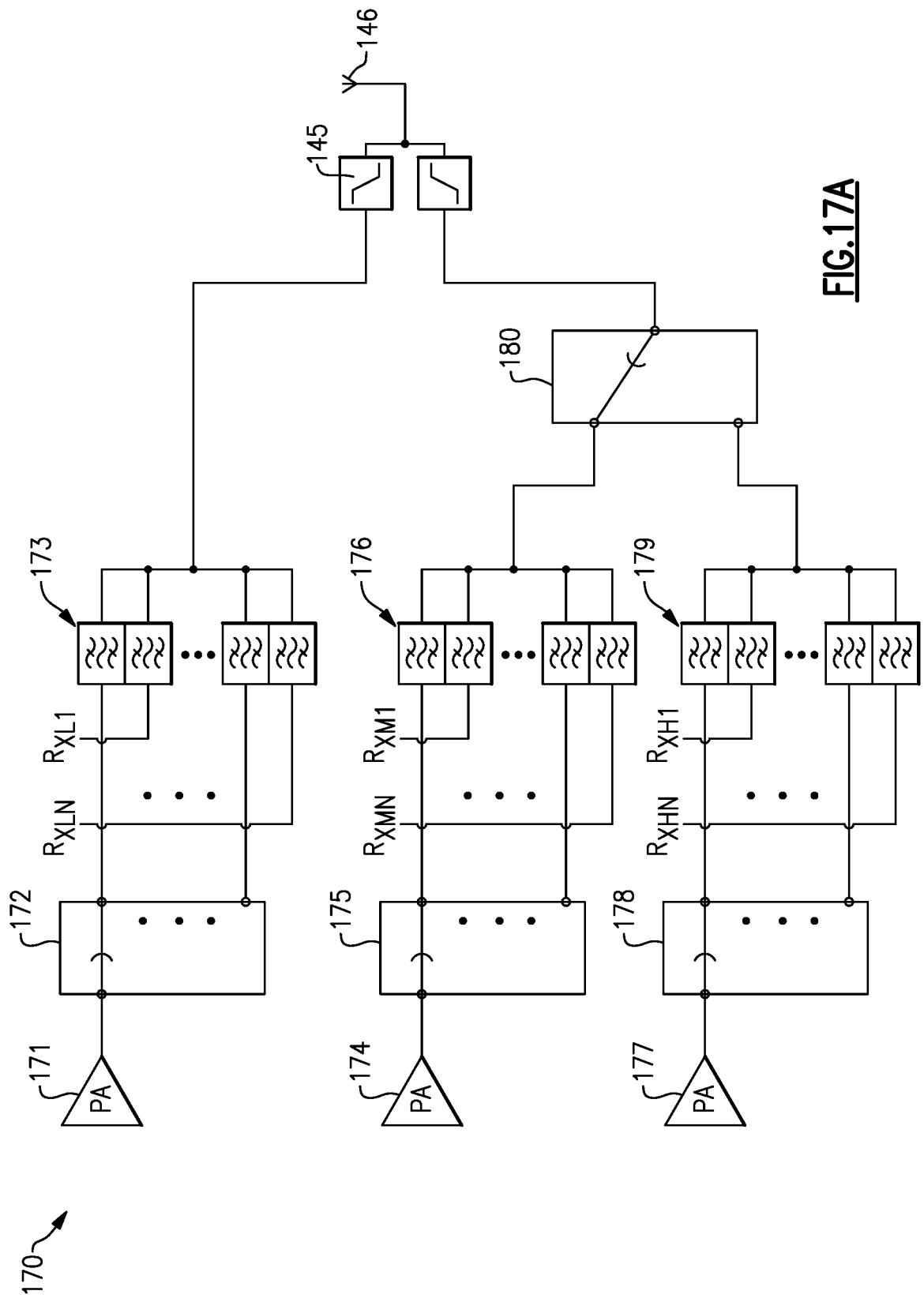

MULTIPLEXER WITH BULK ACOUSTIC WAVE FILTER AND MULTILAYER PIEZOELECTRIC SUBSTRATE FILTER

CROSS REFERENCE TO PRIORITY APPLICATIONS

This application claims the benefit of priority of U.S. Provisional Patent Application No. 62/841,663, filed May 1, 2019 and titled "MULTIPLEXER WITH BULK ACOUSTIC WAVE FILTER AND MULTILAYER PIEZOELECTRIC SUBSTRATE FILTER," and also claims the benefit of priority of U.S. Provisional Patent Application No. 62/841,647, filed May 1, 2019 and titled "MULTIPLEXER WITH ACOUSTIC WAVE RESONATORS," the disclosures of each which are hereby incorporated by reference in their entireties herein.

BACKGROUND

Technical Field

Embodiments of this disclosure relate to multiplexers with filters that include acoustic wave resonators.

Description of Related Technology

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. Designing multiplexers with acoustic wave filters to meet performance specifications with low loss can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multiplexer with acoustic wave filters for filtering radio frequency signals. The multiplexer includes a first acoustic wave filter having a first pass band and a second acoustic wave filter coupled to the first acoustic wave filter at a common node. The first acoustic wave filter includes bulk acoustic wave resonators. The second acoustic wave filter having a second pass band with a frequency range above the first pass band. The second pass band is associated with a different frequency band than the first pass band. The second acoustic wave filter includes multilayer piezoelectric substrate surface acoustic wave resonators.

The bulk acoustic wave resonators have spurious modes below the first pass band. The bulk acoustic wave resonators can have spurious modes below the first pass band, and the multilayer piezoelectric substrate surface acoustic wave resonators can have a gamma of at least 0.85 in the first pass band. Spurious modes of the bulk acoustic wave resonators can be outside of the second pass band. The bulk acoustic wave resonators can have a substantially constant gamma in the second pass band.

The multilayer piezoelectric substrate surface acoustic wave resonators can have a gamma of at least 0.85 in the first pass band.

The multiplexer can further include a third acoustic wave filter coupled to the common node and having a third pass band, in which the third pass band is between the first pass band and the second pass band. The third acoustic wave filter can be a bulk acoustic wave filter. The third acoustic wave filter can be a surface acoustic wave filter. The third acoustic wave filter can be a multilayer piezoelectric substrate surface acoustic wave filter. The third acoustic wave filter can be a temperature compensated substrate surface acoustic wave filter.

The multiplexer can further include a third acoustic wave filter coupled to the common node and having a third pass band and a fourth acoustic wave filter coupled to the common node and having a fourth pass band. The third acoustic wave filter can include second bulk acoustic wave resonators. The fourth acoustic wave filter can include second multilayer piezoelectric surface acoustic wave resonators. The third pass band can be between the first pass band and the fourth pass band. The fourth pass band can be between the third pass band and the second pass band.

The multiplexer can further include a third acoustic wave filter coupled to the common node and having a third pass band and a fourth acoustic wave filter coupled to the common node and having a fourth pass band. The first pass band and the third pass band can be associated with a first frequency band, and the second pass band and the fourth pass band can be associated with a second frequency band. The common node can be configured to receive a carrier aggregation signal including carriers associated with the first frequency band and the second frequency band.

The multiplexer can further include two additional acoustic wave filters coupled to the common node, in which the first pass band being a lowest pass band of all acoustic wave filters of the multiplexer, and in which the second pass band being a highest pass band of all acoustic wave filters of the multiplexer.

The multiplexer can further include four additional acoustic wave filters coupled to the common node, in which the first pass band is a lowest pass band of all acoustic wave filters of the multiplexer, and in which the second pass band being a highest pass band of all acoustic wave filters of the multiplexer.

Another aspect of this disclosure is a wireless communication device that includes an antenna and a radio frequency front end including a multiplexer. The multiplexer can be any suitable multiplexer disclosed herein.

The radio frequency front can include a frequency multiplexing circuit coupled between the common node of the multiplexer and the antenna. The wireless communication device can further include an antenna switch coupled between the common node of the multiplexer and the antenna.

Another aspect of this disclosure is a packaged radio frequency module that includes a multiplexer, a multi-throw radio frequency switch coupled to the multiplexer, and a package enclosing the multiplexer and the multi-throw radio frequency switch. The multiplexer can include any suitable features of the multiplexers disclosed herein.

The packaged radio frequency module can further include a power amplifier enclosed within the package, in which the power amplifier is configured to provide a radio frequency signal to the multiplexer.

The packaged radio frequency module can further include a low noise amplifier enclosed within the package, in which the low noise amplifier is configured to receive a radio frequency signal to the multiplexer.

Another aspect of this disclosure is an acoustic wave filter assembly that includes a bulk acoustic wave die on a substrate and a multilayer piezoelectric substrate die on the substrate. The bulk acoustic wave die includes bulk acoustic wave resonators arranged as a first filter having a first pass band. The multilayer piezoelectric substrate die includes multilayer piezoelectric substrate surface acoustic wave resonators arranged as a second filter having a second pass band. The second filter is coupled to the first filter at a common node. The second pass band is associated with a different frequency band than the first pass band.

The substrate can be a laminate substrate. The acoustic wave filter assembly can further include a package enclosing the bulk acoustic wave die and the multilayer piezoelectric substrate die.

The acoustic wave filter assembly can further include a surface acoustic wave die on the substrate, in which the surface acoustic wave die includes surface acoustic wave resonators arranged as a third filter coupled to the common node. The surface acoustic wave resonators can be temperature compensated surface acoustic wave resonators. The surface acoustic wave resonators can be second multilayer piezoelectric substrate surface acoustic wave resonators.

The first filter and the second filter can be included in a multiplexer that includes one or more suitable features of the multiplexers disclosed herein.

Another aspect of this disclosure is a multiplexer with acoustic wave filters for filtering radio frequency signals. The multiplexer includes a first acoustic wave filter having a first pass band and a second acoustic wave filter coupled to the first acoustic wave filter at a common node. The first acoustic wave filter includes type II bulk acoustic wave resonators, in which the type II bulk acoustic wave resonators have spurious modes below the first pass band. The second acoustic wave filter have a second pass band with a frequency range above the first pass band. The second acoustic wave filter includes type I bulk acoustic wave resonators having spurious modes above the second pass band.

The type I bulk acoustic wave resonators can have a gamma of at least 0.85 in the first pass band. The type II bulk acoustic wave resonators can have a substantially constant gamma in the second pass band.

The multiplexer can further include a third acoustic wave filter coupled to the common node and having a third pass band, in which the third pass band is between the first pass band and the second pass band.

The multiplexer can further include two additional acoustic wave filters coupled to the common node, in which the first pass band is a lowest pass band of all acoustic wave filters of the multiplexer. The multiplexer can support a carrier aggregation of two frequency bands.

The multiplexer can further include four additional acoustic wave filters coupled to the common node, in which the first pass band is a lowest pass band of all acoustic wave filters of the multiplexer, and in which the second pass band is a highest pass band of all acoustic wave filters of the multiplexer. The multiplexer can support a carrier aggregation of three frequency bands.

Another aspect of this disclosure is a multiplexer with acoustic wave filters for filtering radio frequency signals. The multiplexer includes a first acoustic wave filter coupled to a common node and having a first pass band, the first acoustic wave filter including bulk acoustic wave resonators; a second acoustic wave filter coupled to the common node and having a second pass band; a third acoustic wave filter coupled to the common node and having a third pass band; and a fourth acoustic wave filter coupled to the common node and having a fourth pass band, the fourth acoustic wave filter including surface acoustic wave resonators, the first pass band being a lowest pass band of all acoustic wave filters of the multiplexer.

The fourth pass band can be a highest pass band of all acoustic wave filters of the multiplexers.

The surface acoustic wave resonators can include multilayer piezoelectric substrate surface acoustic wave resonators.

The first acoustic wave filter and third acoustic wave filter can each include multilayer piezoelectric substrate surface acoustic wave resonators.

The second acoustic wave filter, third acoustic wave filter, and the fourth acoustic wave filter can each include multilayer piezoelectric substrate surface acoustic wave resonators.

The surface acoustic wave resonators can include temperature compensated surface acoustic wave resonators.

The second acoustic wave filter can include second bulk acoustic wave resonators, the third acoustic wave filter can include second surface acoustic wave resonators, and the second pass band can be below the third pass band.

The second acoustic wave filter can include second bulk acoustic wave resonators, the third acoustic wave filter can include third bulk acoustic wave resonators, and the second pass band can be below the third pass band.

The second acoustic wave filter can include second surface acoustic wave resonators, the third acoustic wave filter can include third surface acoustic wave resonators, and the second pass band can be below the third pass band.

The multiplexer is configured can support a carrier aggregation of two frequency bands.

The multiplexer can further include: a fifth acoustic wave filter coupled to the common node and having a fifth pass band; and a sixth acoustic wave filter coupled to the common node and having a sixth pass band. The multiplexer can support a carrier aggregation of three frequency bands.

The bulk acoustic wave resonators can have spurious modes below the first pass band.

The surface acoustic wave resonators can have a gamma of at least 0.85 in the first pass band.

The bulk acoustic wave resonators can have spurious modes below the first pass band, and the surface acoustic wave resonators have a gamma of at least 0.85 in the first pass band.

Spurious modes of the bulk acoustic wave resonators can be outside of the fourth pass band.

The bulk acoustic wave resonators can have a substantially constant gamma in the fourth pass band.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 2A is a schematic block diagram of a quadplexer according to an embodiment.

FIG. 2B is a graph of transmission characteristics over frequency for filters of the quadplexer of FIG. 2A.

FIG. 3A is a graph of transmission characteristics over frequency for filters of the quadplexer of FIG. 2A compared to standalone filters.

FIG. 3B is a graph of gamma over frequency for the quadplexer of FIG. 2A with bulk acoustic wave (BAW) filters having pass bands below pass bands of a multilayer piezoelectric substrate (MPS) surface acoustic wave (SAW) filters.

FIG. 6A is a schematic block diagram of a duplexer according to an embodiment.

FIG. 6B is a schematic block diagram of a duplexer according to another embodiment.

FIG. 6C is a schematic block diagram of a duplexer according to another embodiment.

FIG. 17A is a schematic diagram of a radio frequency system that includes multiplexers in signal paths between power amplifiers and an antenna.

DETAILED DESCRIPTION OF CERTAIN EMBODIMENTS

Figure 1B:
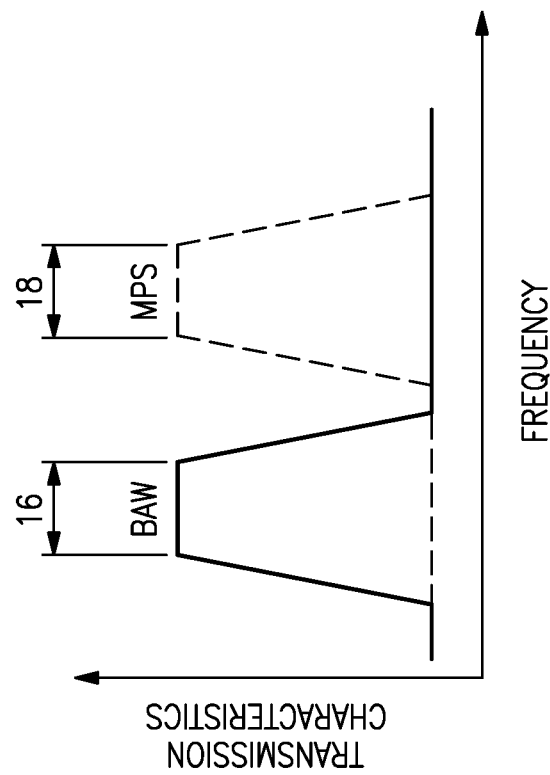
FIG. 1B is a graph of transmission characteristics over frequency for filters of the duplexer of FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Surface acoustic wave (SAW) and bulk acoustic wave (BAW) technologies are both capable of achieving relatively high impedance values out-of-band. Certain high performance BAW filters can outperform SAW filters in terms of out-of-band impedance magnitude over a wider frequency span. At the same time, BAW filters can be suited to filter signals having frequencies up to about 10 gigahertz (GHz). BAW filters can achieve relatively low insertion loss and desirable rejection of adjacent frequency bands. On the other hand, SAW filters can be lower cost than BAW filters. SAW filters include, for example, multilayer piezoelectric substrate (MPS) SAW filters, temperature compensated SAW (TCSAW) filters, and non-temperature compensated SAW filters. However, SAW filters can encounter difficulty filtering signals at relatively high frequencies, such as frequencies above about 2.7 GHz, in certain applications. Given these differences in technology, SAW filters can be used for filtering relatively lower frequencies than BAW filters in a variety of applications and thereby save costs.

Low loss multiplexer devices are desired for relatively complex radio frequency (RF) systems for mobile communication. A multiplexer can include band pass filters coupled together at a common node. Insertion loss of a filter in the multiplexer is typically degraded compared to standalone filters due to loading from other filters of the multiplexer. This disclosure provides low loss multiplexers that include a bulk acoustic wave (BAW) filter and a multilayer piezoelectric substrate (MPS) SAW filter. An MPS SAW filter can be referred to as an MPS filter. Other low loss multiplexers are disclosed.

Low insertion loss can be difficult to achieve in a multiplexer that includes a plurality of filters. This can be due to loading. To address loading problems, multiplexers with a BAW filter and an MPS SAW filter are disclosed. By setting the pass band of the BAW filter to a lower frequency than the pass band of the MPS SAW filter, loading can be reduced and/or almost eliminated. The BAW filter can achieve desirable gamma for higher frequencies and the MPS SAW filter can achieve desirable gamma for lower frequencies. Gamma is a reflection coefficient. A multiplexer with a BAW filter having the lowest pass band of all filters of the multiplexer and an MPS SAW filter having the highest pass band of all filters of the multiplexer can achieve low loading loss and low insertion loss for the multiplexer. Other types of SAW filters (e.g., a temperature compensated SAW filter) can be implemented in place of the MPS SAW filter and achieve relatively low insertion loss for filters in a multiplexer in certain instances.

Figure 1A:
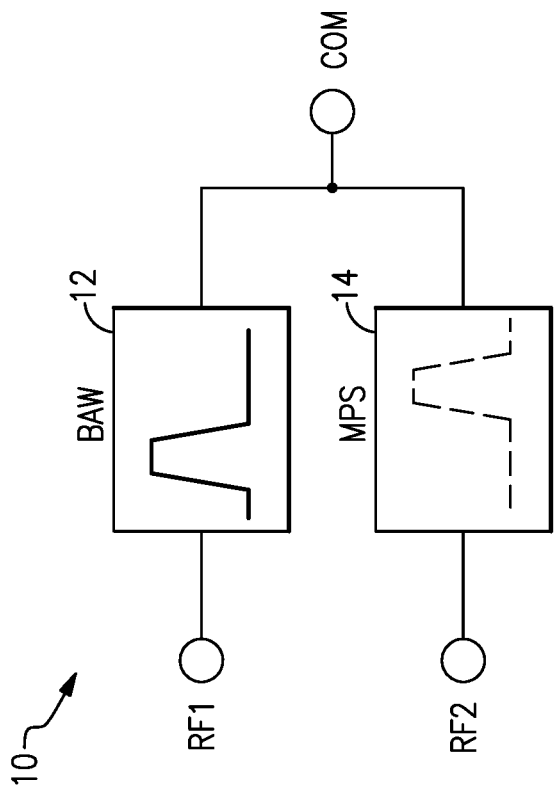
FIG. 1A is a schematic block diagram of a duplexer according to an embodiment.

FIG. 1A is a schematic block diagram of a duplexer 10 according to an embodiment. The illustrated duplexer 10 includes a BAW filter 12 and an MPS filter 14. The BAW filter 12 and the MPS filter 14 are band pass filters coupled together at a common node COM. The BAW filter 12 is coupled between a first RF node RF1 and the common node COM. The BAW filter 12 includes BAW resonators. The BAW resonators can be film bulk acoustic wave resonators (FBARs). In some other applications, the BAW resonators can include solidly mounted resonators (SMRs). The MPS filter 14 is coupled between a second RF node RF2 and the common node COM. The MPS filter 14 includes MPS SAW resonators. For example, all acoustic wave resonators of the MPS filter 14 can be MPS SAW resonators. MPS SAW resonators can include layered substrate SAW resonators and/or bonded substrate SAW resonators. The BAW filter 12 and the MPS filter 14 can be associated with the same frequency band in certain instances, in which one filter is a transmit filter and the other filter is a receive filter. The BAW filter 12 and the MPS filter 14 can be associated with different frequency bands in some instances, such as in diversity receive applications and/or in any other suitable applications in which filtering of different bands in a duplexer is desired. The BAW filter 12 and the MPS filter 14 can be associated with different frequency sub-bands within the same frequency band in some instances.

FIG. 1B is a graph of transmission characteristics over frequency for filters of the duplexer 10 of FIG. 1A. FIG. 1B illustrates a first pass band 16 of the BAW filter 12 and a second pass band of the MPS filter 14. As illustrated, the second pass band 18 spans a frequency range above the first pass band 16. As also illustrated in FIG. 1B, the first pass band 16 spans a frequency range below the second pass band 18.

Referring back to FIG. 1A, the BAW filter 12 can have the first pass band 16 and a first stop band above the first pass band 16. In the first stop band, the frequency response of the BAW filter 12 can be relatively clean. The BAW filter 12 can include type II BAW resonators that have spurious modes below their respective resonant frequencies. Accordingly, spurious modes of the BAW filter 12 can be outside of the second pass band 18 of the MPS filter 14. The MPS filter 14 can have the second pass band 18 and a second stop band below second pass band 18. In the second stop band, the frequency response of the MPS filter 14 can be relatively clean. MPS SAW resonators of the MPS filter 14 can have spurious modes above their respective resonant frequencies. Accordingly, spurious modes of the MPS filter 14 can be outside of the first pass band 16 of the BAW filter 12.

The duplexer 10 can be a relatively loss low duplexer due to the spurious modes of the BAW filter 12 being outside of the second pass band 18 of the MPS filter 14 and the spurious modes of the MPS filter 14 being outside of the first pass band 16 of the BAW filter 12.

Multiplexers with more filters coupled to common node can have more significant technical challenges related to loading relative to multiplexers with fewer filters coupled to a common node. For example, loading can be a more significant technical challenge to address for quadplexers than for duplexers because more filters are coupled together at a common node that can contribute to loading in quadplexers. Accordingly, in quadplexers, there can be more other filters that can undesirably impact insertion loss in a pass band of a particular filter than in duplexers.

FIG. 2A is a schematic block diagram of a quadplexer 20 according to an embodiment. The quadplexer 20 includes four acoustic wave filters coupled to a common node COM. As illustrated, the quadplexer 20 includes a first BAW filter 22, a second BAW filter 24, a first MPS filter 26, and a second MPS filter 28. The first BAW filter 22 is coupled between a first RF node RF1 and the common node COM. The second BAW filter 24 is coupled between a second RF node RF2 and the common node COM. The first BAW filter 22 and the second BAW filter 24 each include BAW resonators (e.g., FBARs and/or SMRs). In an embodiment, the acoustic wave resonators of the first BAW filter 22 and the second BAW filter 24 consist of FBARs. The first MPS filter 26 is coupled between a third RF node RF3 and the common node COM. The second MPS filter 28 is coupled between a fourth RF node RF4 and the common node COM. The first MPS filter 26 and the second MPS filter 28 each include MPS SAW resonators.

In certain applications, the quadplexer 20 can be similar to a first duplexer that includes BAW filters 22 and 24 for first frequency band and a second duplexer that includes MPS filters 26 and 28 for a second frequency band coupled together at the common node COM, in which the second frequency band is above the first frequency band.

FIG. 2B is a graph of transmission characteristics over frequency for filters of the quadplexer 20 of FIG. 2A. FIG. 2B illustrates a first pass band 32 of the first BAW filter 22, a second pass band 34 of the second BAW filter 24, a third pass band 36 of the first MPS filter 26, and a fourth pass band 38 of the second MPS filter 28. The first pass band 32 of the first BAW filter 22 is lower than the pass bands of all other acoustic wave filters of the quadplexer 20. The fourth pass band 38 of the second MPS filter 28 is higher than the pass bands of all other acoustic wave filters of the quadplexer 20. The second pass band 34 of the second BAW filter 24 is below the third pass band 36 of the first MPS filter 34. Accordingly, the pass bands of each BAW filter of the quadplexer 20 are below the pass bands of each MPS filter of the quadplexer 20.

The BAW filters 22 and 24 can have respective stop bands above their pass bands 32 and 34. The BAW filters 22 and 24 can be formed of type II BAW resonators that have spurious modes below their respective resonant frequencies. Accordingly, spurious modes of the BAW filters 22 and 24 can be outside of the pass bands 36 and 38 of the MPS filters 26 and 28, respectively. The MPS filters 26 and 28 can have respective stop bands below their pass bands 36 and 38. The MPS filters 26 and 28 can be formed of MPS SAW resonators that have spurious modes above their respective resonant frequencies. Accordingly, spurious modes of the MPS filters 26 and 28 can be outside of the pass bands 32 and 34 of the BAW filters 22 and 24, respectively.

FIG. 3A is a graph of transmission characteristics over frequency for filters of the quadplexer 20 of FIG. 2A compared to standalone filters. In the quadplexer 20, BAW filters 22 and 24 have pass bands below pass bands of the MPS filters 26 and 28. Insertion loss degradation can correspond to the reduction in transmission characteristics due to loading in the quadplexer 20. According, the graph in FIG. 3A should illustrate the impact of loading in the quadplexer 20 by the difference between the transmission characteristics for a standalone filter and the transmission characteristics for the same filter in the quadplexer 20. FIG. 3A indicates that insertion loss degradation for BAW filters 22 and 24 is relatively small. In addition, FIG. 3A indicates that insertion loss degradation is relatively small for the MPS filter 26 and 28.

FIG. 3B is a graph of gamma over frequency for the BAW filers 22 and 24 and the MPS filters 26 and 28 the quadplexer 20 of FIG. 2A in which the BAW filters 22 and 24 have lower pass bands than the MPS filters 26 and 28. FIG. 3B illustrates that there is relatively high gamma for the BAW filters 22 and 24 above the pass bands of the BAW filters 22 and 24. Relatively high gamma for the BAW filters 22 and 24 is indicated at for the respective pass bands of the MPS filters 26 and 28. The BAW filters 22 and 24 can have gamma of at least 0.85 and/or at least 0.9 in the pass bands of the MPS filters 26 and 28. A maximum value of gamma can be 1. A gamma of 1 can indicate 100% reflection. FIG. 3B illustrates that there is relatively high gamma for the MPS filters 26 and 28 below the pass bands of the MPS filters 26 and 28. Relatively high gamma for the MPS filters 26 and 28 is indicated for the respective pass bands of the BAW filters 22 and 24. The MPS filters 26 and 28 can have gamma of at least 0.85 and/or at least 0.9 in the pass bands of the BAW filters 22 and 24. Accordingly, the quadplexer 20 of FIG. 2A with BAW filters 22 and 24 having lower pass bands than MPS filters 26 and 28 is a desirable combination for multiplexing.

Figure 4B:
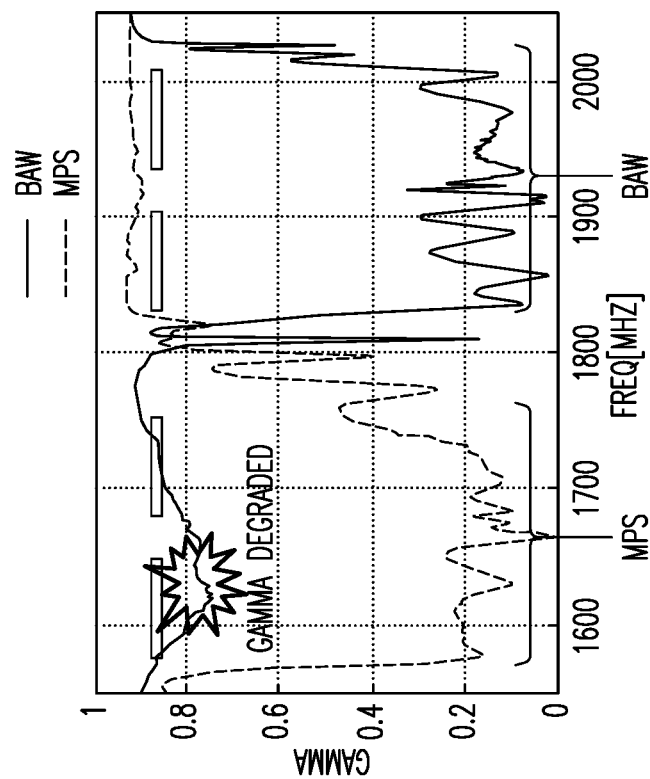
FIG. 4B is a graph of gamma over frequency for the quadplexer corresponding to FIG. 4A.
Figure 4A:
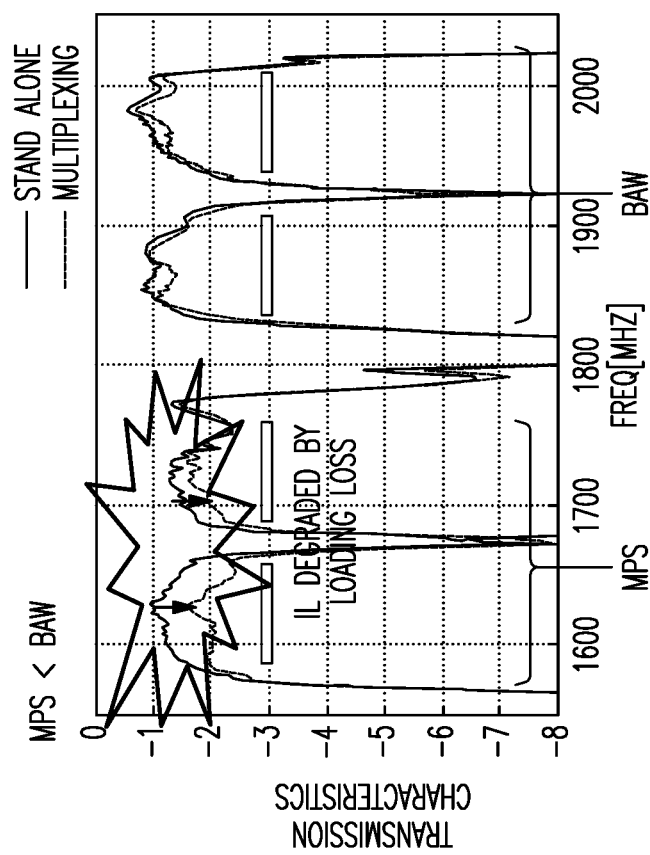
FIG. 4A is a graph of transmission characteristics over frequency for a quadplexer compared to standalone filters.

FIG. 4A is a graph of transmission characteristics over frequency for a quadplexer compared to standalone filters. The quadplexer corresponding to the graphs of FIGS. 4A and 4B includes two MPS filters and two BAW filters, in which the MPS filters have lower pass bands than the BAW filters. The graph of FIG. 4A indicates significant insertion loss degradation in pass bands of the MPS filters due to loading loss.

FIG. 4B is a graph of gamma over frequency for a quadplexer with two MPS filters having pass bands below two BAW filters. The graph of FIG. 4B indicates that gamma for the BAW filters is degraded. The gamma degradation corresponds to pass bands of the MPS filters.

Figures 5A, 5B:
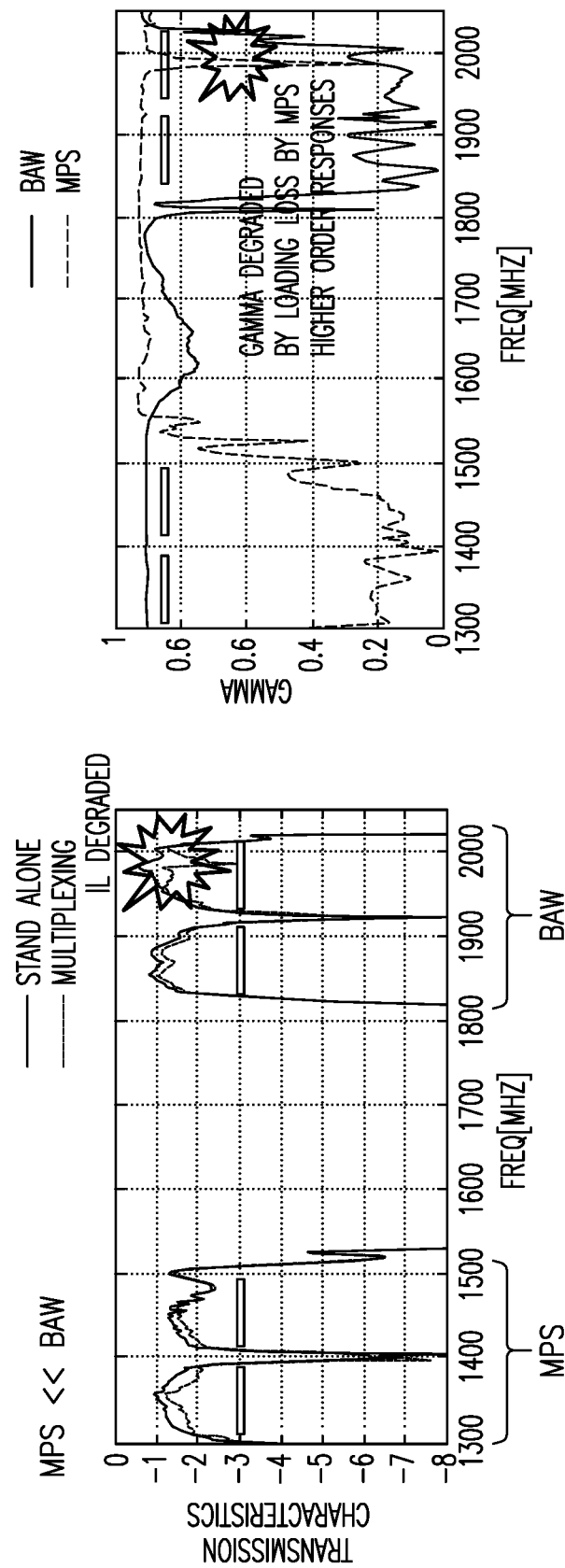
FIG. 5A is a graph of transmission characteristics over frequency for a quadplexer compared to standalone filters.
FIG. 5B is a graph of gamma over frequency for the quadplexer corresponding to FIG. 5A.

FIG. 5A is a graph of transmission characteristics over frequency for a quadplexer compared to standalone filters. The quadplexer corresponding to the graphs of FIGS. 5A and 5B includes two MPS filters and two BAW filters, in which the MPS filters have significantly lower pass bands than the BAW filters. There is over 250 megahertz (MHz) between the lower edge of a BAW filter pass band an upper edge of an MPS filter pass band as indicated by FIG. 5A. The graph of FIG. 5A indicates significant insertion loss degradation in a pass band of the BAW filter with a higher pass band.

FIG. 5B is a graph of gamma over frequency for a quadplexer with two MPS filters having pass bands significantly below two BAW filters. The graph of FIG. 5B indicates that gamma for the MPS filters is degraded. The gamma degradation can be due to loading loss resulting from higher order spurious responses of the MPS filters. The gamma degradation corresponds to the pass band of the BAW filter with the higher pass band.

Based on the above simulation results, it can be desirable for a quadplexer to include (a) filters for a lower frequency band with spurious responses below the pass bands and (b) filters for a higher frequency band with relatively high gamma below the pass band. The filters for the lower frequency band can include a transmit filter and a receive filter. The filters for the lower frequency band can include a BAW filter. The filters for the higher frequency band can include a transmit filter and a receive filter. The filters for the higher frequency band can include one or more of an MPS filter, a SAW filter, a TCSAW filter, or a type I BAW filter.

Although the duplexer 10 of FIG. 1A and the quadplexer 20 of FIG. 2A include a BAW filter and an MPS filter, the principles and advantages disclosed herein can be applied to other types of filters with certain characteristics of the filters of the duplexer 10 of FIG. 1A and the quadplexer 20 of FIG. 2A. For example, a filter with a lowest pass band in a multiplexer can have spurious modes below its pass band. Such a filter can be a type II BAW filter. As another example, a filter with a highest pass band of a multiplexer can have relatively high gamma below its pass band. Such a filter can be an MPS filter, a SAW filter, a TCSAW filter, or a type I BAW filter. In certain applications, a multiplexer can include at least one acoustic wave filter with two or more different types of acoustic wave devices implemented with frequency domain characteristics of a filter of the duplexer 10 and/or a filter of the quadplexer 20.

FIGS. 6A to 6C illustrate duplexers with a BAW filter having a first pass band that is below a second pass band of another type of acoustic wave filter. The other acoustic wave filter can be associated with the same frequency band as the BAW filter (e.g., the filters can be for uplink and downlink signals of the same frequency band). In some other applications, the BAW filter and the other acoustic wave filter can have pass bands associated with different frequency bands.

FIG. 6A is a schematic block diagram of a duplexer 60 according to an embodiment. As illustrated, the duplexer 60 includes a BAW filter 12 and a SAW filter 62 coupled to each other at a common node COM. The BAW filter 12 has a first pass band that is below a second pass band of the SAW filter 62. The duplexer 60 is like the duplexer 10 of FIG. 1A, except that a SAW filter 62 is implemented in place of the MPS filter 14. The SAW filter 62 includes SAW devices, such as SAW resonators. The SAW resonators can be any suitable SAW resonators, including without limitation TCSAW resonators, non-temperature compensated SAW resonators, or MPS SAW resonators.

FIG. 6B is a schematic block diagram of a duplexer 63 according to an embodiment. As illustrated, the duplexer 63 includes a BAW filter 12 and a TCSAW filter 64 coupled to each other at a common node COM. The BAW filter 12 has a first pass band that is below a second pass band of the TCSAW filter 64. The duplexer 63 is like the duplexer 10 of FIG. 1A, except that a TCSAW filter 64 is implemented in place of the MPS filter 14. The TCSAW filter 64 includes TCSAW resonators.

FIG. 6C is a schematic block diagram of a duplexer 65 according to an embodiment. As illustrated, the duplexer 65 includes a type II BAW filter 67 and a type I BAW filter 68 coupled to each other at a common node COM. The type II BAW filter 67 has a first pass band that is below a second pass band of the type I BAW filter 68. The type II BAW filter 67 includes BAW resonators that have spurious modes below their resonant frequencies. The type I BAW filter 68 includes BAW resonators that have spurious modes above their resonant frequencies.

Figure 7A:
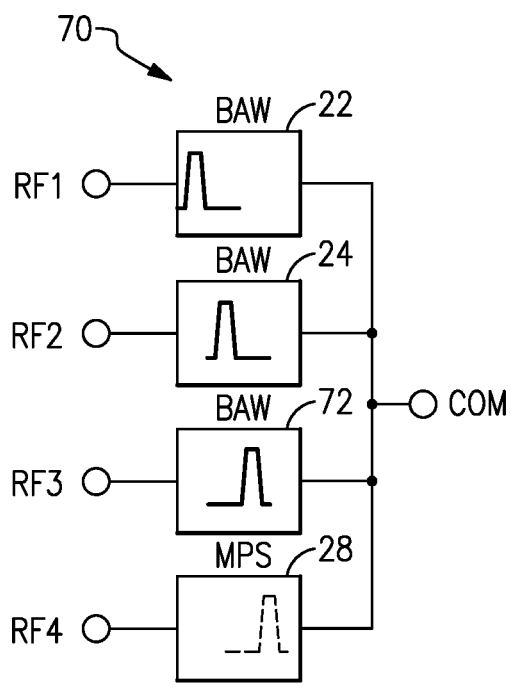
FIG. 7A is a schematic block diagram of a quadplexer according to an embodiment.
Figure 7B:
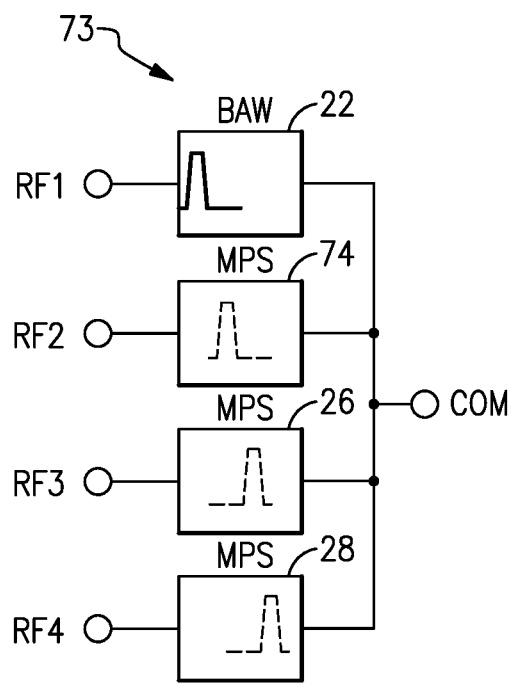
FIG. 7B is a schematic block diagram of a quadplexer according to another embodiment.

FIGS. 7A and 7B illustrate quadplexers with a BAW filter having a lowest pass band of the filters of the quadplexer and an MPS filter having a highest pass band of the filters of the quadplexer. The filters with the middle pass bands of the quadplexers are implemented by different types of acoustic wave filters than the quadplexer 20 of FIG. 2A.

FIG. 7A is a schematic block diagram of a quadplexer 70 according to an embodiment. The quadplexer 70 is like the quadplexer 20 of FIG. 2A except that the MPS filter 26 of the quadplexer 20 is replaced by the BAW filter 72 in the quadplexer 70.

FIG. 7B is a schematic block diagram of a quadplexer 73 according to another embodiment. The quadplexer 73 is like the quadplexer 20 of FIG. 2A except that the BAW filter 24 of the quadplexer 20 is replaced by the MPS filter 74 in the quadplexer 73.

Figure 8:
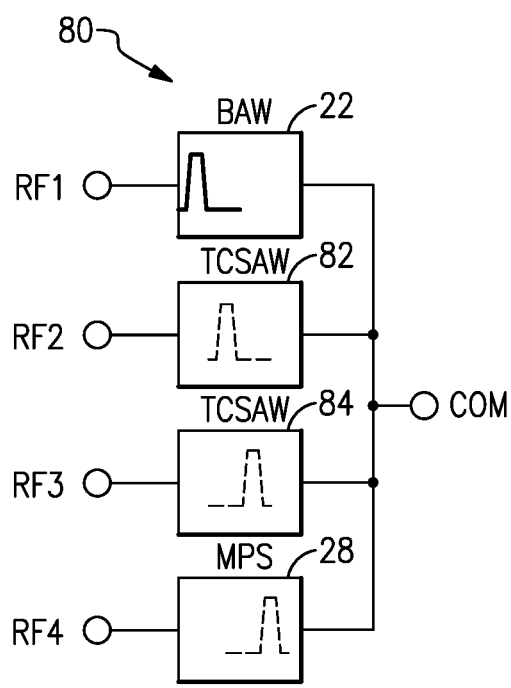
FIG. 8 is a schematic block diagram of a quadplexer according to another embodiment.

FIG. 8 is a schematic block diagram of a quadplexer 80 according to another embodiment. The quadplexer 80 includes a BAW filter 22, a first TCSAW filter 82, a second TCSAW filter 84, and an MPS filter 28. The BAW filter 22 has a lowest pass band of the filters of the quadplexer 80. The MPS filter 28 has a highest pass band of the filters of the quadplexer 80. The filters with the middle pass bands of the quadplexer 80 are implemented by TCSAW resonators in the quadplexer 80. The quadplexer 80 is an example of a quadplexer in which a different type of acoustic wave resonator implements filters with the middle two pass bands than filters with the highest and lowest pass bands. The quadplexer 80 is like the quadplexer 20 of FIG. 2A except that the BAW filter 24 of the quadplexer 20 and the MPS filter 26 are replaced by the TCSAW filter 82 and the TCSAW filter 84, respectively, in the quadplexer 80.

Figure 9A:
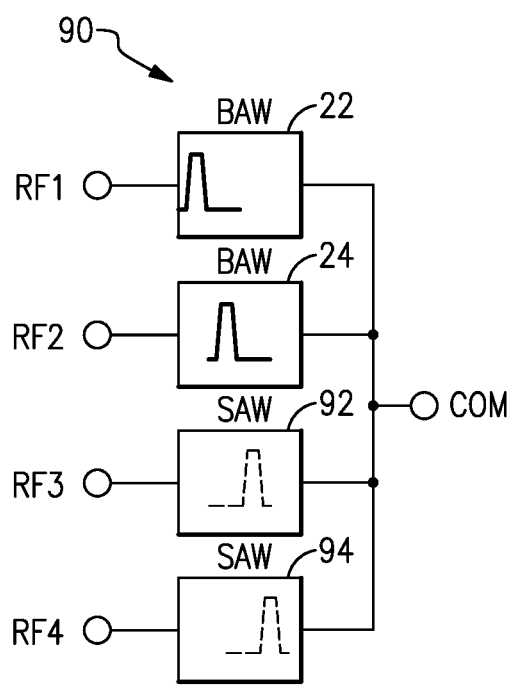
FIG. 9A is a schematic block diagram of a quadplexer according to another embodiment.
Figure 9B:
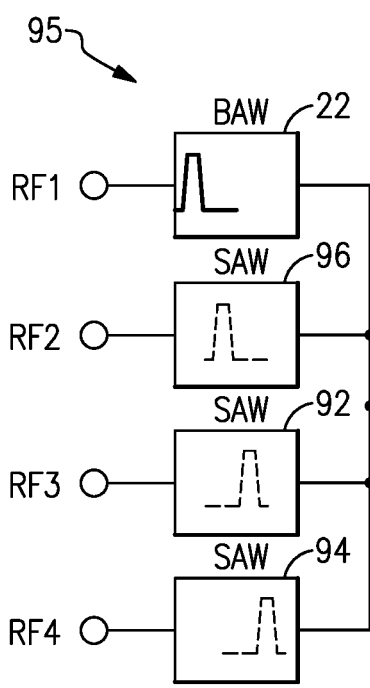
FIG. 9B is a schematic block diagram of a quadplexer according to another embodiment.
Figure 9C:
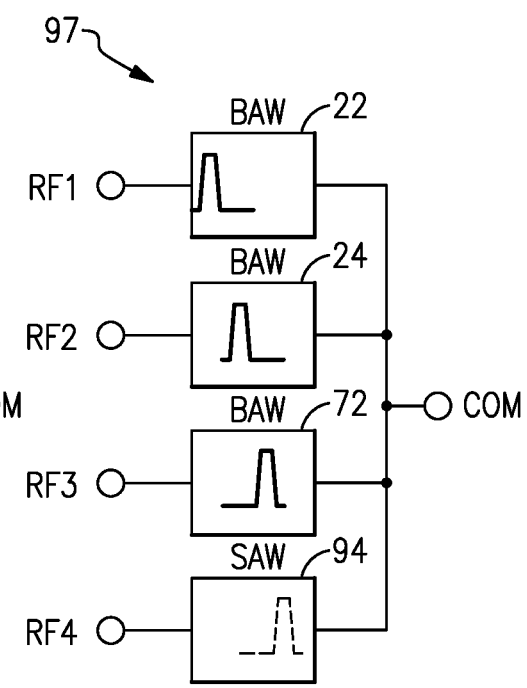
FIG. 9C is a schematic block diagram of a quadplexer according to another embodiment.

FIGS. 9A to 9C illustrate quadplexers with a BAW filter having a lowest pass band of the filters of the quadplexer and a SAW filter having a highest pass band of the filters of the quadplexer. These figures illustrate that SAW filters can be implemented in combination with one or more BAW filters in a multiplexer in accordance with any suitable principles and advantages disclosed herein. The SAW filters can include without limitation one or more of TCSAW filters, non-temperature compensated SAW filters, or MPS filters.

FIG. 9A is a schematic block diagram of a quadplexer 90 according to another embodiment. The quadplexer 90 includes a first BAW filter 22, a second BAW filter 24, a first SAW filter 92, and a second SAW filter 94 coupled together at a common node COM. The first BAW filter 22 and the second BAW filter 24 each include BAW resonators (e.g., FBARs and/or SMRs). In an embodiment, the acoustic wave resonators of the first BAW filter 22 and the second BAW filter 24 consist of FBARs. The first SAW filter 92 and the second SAW filter 94 include SAW resonators. The SAW resonators of the first SAW filter 92 and the second SAW filter 94 can include one or more TCSAW resonators, one or more non-temperature compensated SAW resonators, one or more MPS resonators, or any suitable combination thereof. In certain applications, the quadplexer 90 can be similar to a first duplexer that includes BAW filters 22 and 24 for first frequency band and a second duplexer that includes SAW filter 92 and 94 for a second frequency band coupled together at the common node COM, in which the second frequency band is above the first frequency band.

The BAW filters 22 and 24 can have respective stop bands above their pass bands. The BAW filters 22 and 24 can be a type II BAW filters that have spurious modes below their respective resonant frequencies. The SAW filters 26 and 28 can have respective stop bands below their pass bands. The SAW filters 26 and 28 can have spurious modes above their respective resonant frequencies.

FIG. 9B is a schematic block diagram of a quadplexer 95 according to another embodiment. The quadplexer 95 is like the quadplexer 90 of FIG. 9A except that SAW filter 96 is included in the quadplexer 95 in place of the BAW filter 24 of the quadplexer 90.

FIG. 9C is a schematic block diagram of a quadplexer 97 according to another embodiment. The quadplexer 97 is like the quadplexer 90 of FIG. 9A except that BAW filter 72 is included in the quadplexer 97 in place of the SAW filter 92 of the quadplexer 90.

Figure 10A:
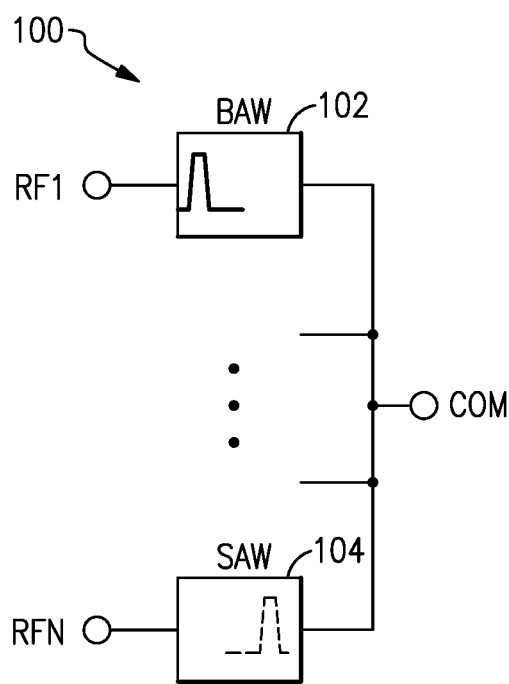
FIG. 10A is a schematic block diagram of a multiplexer according to an embodiment.
Figure 10B:
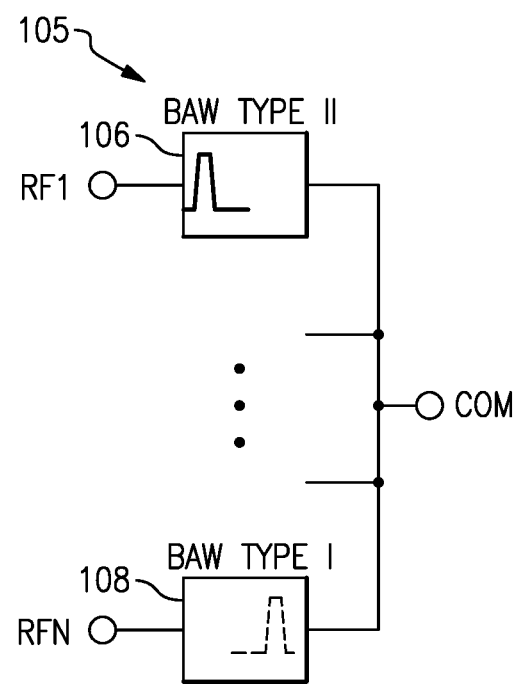
FIG. 10B is a schematic block diagram of a multiplexer according to another embodiment.

Although example embodiments are discussed with duplexers and quadplexers, any suitable the principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. A multiplexer can include (a) filters for a lower frequency band with spurious responses below the pass bands and (b) filters for a higher frequency band with relatively high gamma below the pass band, in which the higher frequency band is above the lower frequency band. The filters for the lower frequency band can include a BAW filter. The filters for the higher frequency band can include one or more of an MPS filter, a SAW filter, a TCSAW filter, or a type I BAW filter. A multiplexer can include additional filters for one or more additional frequency bands in certain applications. FIGS. 10A and 10B illustrate example multiplexers.

FIG. 10A is a schematic block diagram of a multiplexer 100 according to an embodiment. The multiplexer 100 includes a plurality of acoustic wave filters coupled to a common node COM. The plurality of acoustic wave filters can include any suitable number of filters including, for example, 3 acoustic wave filters, 4 acoustic wave filters, 5 acoustic wave filters, 6 acoustic wave filters, 7 acoustic wave filters, 8 acoustic wave filters, or more acoustic wave filters. Each of the acoustic wave filters can be band pass filters. The plurality of acoustic wave filters includes a BAW filter 102 and a SAW filter 104. The multiplexer 100 also includes one or more other acoustic wave filters. The BAW filter 102 is coupled between a first RF node RF1 and the common node COM. The BAW filter 102 has the lowest pass band of all acoustic wave filters of the multiplexer 100. The SAW filter 104 has the highest pass band of all acoustic wave filters of the multiplexer 100. The SAW filter 104 can be an MPS filter, a TCSAW filter, or a non-temperature compensated SAW filter. The one or more other acoustic wave filters have pass bands between the pass band of the BAW filter 102 and the pass band of the SAW filter 104. The one or more other filters can include one or more BAW filters and/or one or more SAW filters. In the multiplexer 100, each BAW filter of the plurality of acoustic wave filters can have a lower pass band than a pass band of each SAW filter of the plurality of acoustic wave filters.

The multiplexer 100 can include (a) BAW filters for a lower frequency band with spurious responses below the pass bands and (b) SAW filters for a higher frequency band with relatively high gamma below the pass band, in which the higher frequency band is above the lower frequency band. The multiplexer 100 can include additional filters for one or more additional frequency bands in certain applications.

FIG. 10B is a schematic block diagram of a multiplexer 105 according to an embodiment. The multiplexer 105 includes a plurality of BAW filters coupled to a common node COM. The plurality of BAW filters can include any suitable number of filters including, for example, 3 BAW filters, 4 BAW filters, 5 BAW filters, 6 BAW filters, 7 BAW filters, 8 BAW filters, or more BAW filters. Each of the BAW filters can be band pass filters. A type II BAW filter has spurious modes below its resonant frequency. A type I BAW filter has spurious modes above its resonant frequency. The plurality of BAW includes a type II BAW filter 106 and a type I BAW filter 108. The multiplexer 105 also includes one or more other BAW filters. The type II BAW filter 106 is coupled between a first RF node RF1 and the common node COM. The type II BAW filter 106 has the lowest pass band of all BAW filters of the multiplexer 105. The type I BAW filter 107 has the highest pass band of all acoustic wave filters of the multiplexer 105. The one or more other BAW filters have pass bands between the pass band of the type II BAW filter 106 and the pass band of the type I BAW filter 107. In the multiplexer 105, each type II BAW filter of the plurality of BAW filters can have a lower pass band than a pass band of each type I BAW filter of the plurality of BAW filters.

Multiplexers disclosed herein can be used to facilitate carrier aggregation. Such multiplexers can include band pass filters for at least two different frequencies. In some instances, carrier aggregations can aggregate carriers in two different frequency bands, three different frequency bands, four different frequency bands, or more frequency bands. A multiplexer can include a transmit filter and/or a receive filter for each carrier in a carrier aggregation. As an example, for a two band carrier aggregation, a multiplexer can include a first transmit filter and a first receive filter for a first frequency band of a first carrier and a second transmit filter and a second receive filter for a second carrier of a second frequency band. Some bands can be receive only or transmit only and for such filters only one filter can be included in a multiplexer to aggregate a carrier of that band with another a carrier. In another example, a multiplexer can include 6 filters to support a three band carrier aggregation in which there is a transmit filter and a receive filter for each of the three bands. As one more example, a multiplexer can include 8 filters to support a four band carrier aggregation in which there is a transmit filter and a receive filter for each of the four bands.

Example Long Term Evolution (LTE) frequency bands for two band inter-band carrier aggregations, three band inter-band carrier aggregations, and four band inter-band carrier aggregations are included in the tables below. Any suitable principles and advantages of the multiplexers disclosed herein can be implemented to support any of the carrier aggregations identified in the tables below.

Quadplexers disclosed herein can implement inter-band carrier aggregations with two different bands. For example, the quadplexers disclosed herein can support two band carrier aggregations with any suitable LTE band combinations included in Tables 1A and/or 1B.

TABLE 1A

Inter-Band Carrier Aggregation Combinations of 2 Bands

| First Band | Second Band |
|---|---|
| 1 | 3 |
| 1 | 5 |
| 1 | 7 |
| 1 | 8 |
| 1 | 11 |
| 1 | 18 |
| 1 | 19 |
| 1 | 20 |
| 1 | 21 |
| 1 | 26 |
| 1 | 28 |
| 1 | 32 |
| 1 | 38 |
| 1 | 40 |
| 1 | 41 |
| 1 | 42 |
| 1 | 43 |
| 1 | 46 |
| 2 | 4 |
| 2 | 5 |
| 2 | 7 |
| 2 | 12 |
| 2 | 13 |
| 2 | 14 |
| 2 | 17 |
| 2 | 28 |
| 2 | 29 |
| 2 | 30 |
| 2 | 46 |
| 2 | 48 |
| 2 | 49 |
| 2 | 66 |
| 2 | 71 |
| 2 | 252 |
| 2 | 255 |
| 3 | 5 |
| 3 | 7 |
| 3 | 8 |
| 3 | 11 |
| 3 | 18 |
| 3 | 19 |
| 3 | 20 |
| 3 | 21 |
| 3 | 26 |
| 3 | 27 |
| 3 | 28 |
| 3 | 31 |
| 3 | 32 |
| 3 | 38 |
| 3 | 40 |
| 3 | 41 |
| 3 | 42 |
| 3 | 43 |
| 3 | 46 |
| 3 | 69 |
| 4 | 5 |
| 4 | 7 |
| 4 | 12 |
| 4 | 13 |
| 4 | 17 |
| 4 | 27 |
| 4 | 28 |
| 4 | 29 |
| 4 | 30 |
| 4 | 46 |
| 4 | 48 |
| 4 | 71 |
| 4 | 252 |

TABLE 1A-continued

Inter-Band Carrier Aggregation Combinations of 2 Bands

| First Band | Second Band |
|---|---|
| 4 | 255 |
| 5 | 12 |
| 5 | 13 |
| 5 | 17 |
| 5 | 25 |
| 5 | 28 |
| 5 | 29 |
| 5 | 30 |
| 5 | 38 |
| 5 | 40 |
| 5 | 41 |
| 5 | 46 |
| 5 | 48 |
| 5 | 66 |
| 7 | 8 |
| 7 | 12 |
| 7 | 20 |
| 7 | 22 |
| 7 | 26 |
| 7 | 28 |
| 7 | 30 |
| 7 | 32 |
| 7 | 40 |
| 7 | 42 |
| 7 | 46 |
| 7 | 66 |
| 8 | 11 |
| 8 | 20 |
| 8 | 27 |
| 8 | 28 |
| 8 | 32 |
| 8 | 38 |
| 8 | 39 |
| 8 | 40 |
| 8 | 41 |
| 8 | 42 |
| 8 | 46 |
| 11 | 18 |
| 11 | 26 |
| 11 | 28 |
| 11 | 41 |
| 11 | 42 |
| 11 | 46 |
| 12 | 25 |
| 12 | 30 |
| 12 | 46 |
| 12 | 48 |
| 13 | 46 |
| 13 | 48 |
| 13 | 66 |
| 13 | 252 |
| 13 | 255 |
| 14 | 30 |
| 14 | 66 |
| 18 | 28 |
| 19 | 21 |
| 19 | 28 |
| 19 | 42 |
| 19 | 48 |
| 20 | 28 |
| 20 | 31 |
| 20 | 32 |
| 20 | 38 |
| 20 | 40 |
| 20 | 42 |
| 20 | 43 |
| 20 | 67 |
| 20 | 75 |
| 20 | 76 |
| 21 | 28 |
| 21 | 42 |
| 21 | 46 |

TABLE 1B

Inter-Band Carrier Aggregation Combinations of 2 Bands (continued)

| First Band | Second Band |
|---|---|
| 23 | 29 |
| 25 | 26 |
| 25 | 41 |
| 25 | 46 |
| 26 | 41 |
| 26 | 46 |
| 26 | 48 |
| 28 | 38 |
| 28 | 40 |
| 28 | 41 |
| 28 | 42 |
| 29 | 30 |
| 29 | 66 |
| 29 | 70 |
| 30 | 66 |
| 32 | 42 |
| 32 | 43 |
| 34 | 33 |
| 34 | 41 |
| 38 | 40 |
| 39 | 40 |
| 39 | 41 |
| 39 | 42 |
| 33 | 46 |
| 40 | 41 |
| 40 | 42 |
| 40 | 43 |
| 40 | 46 |
| 41 | 42 |
| 41 | 46 |
| 41 | 48 |
| 42 | 43 |
| 42 | 46 |
| 46 | 48 |
| 46 | 66 |
| 46 | 70 |
| 46 | 71 |
| 48 | 66 |
| 48 | 71 |
| 66 | 70 |
| 66 | 71 |
| 70 | 71 |

Multiplexers disclosed herein can implement inter-band carrier aggregations with three different bands. For example, a hexaplexer in accordance with any suitable principles and advantages disclosed herein can support three band carrier aggregations with any suitable LTE band combinations included in Tables 2A and/or 2B.

TABLE 2A

Inter-Band Carrier Aggregation Combinations of 3 Bands

| First Band | Second Band | Third Band |
|---|---|---|
| 1 | 3 | 5 |
| 1 | 3 | 7 |
| 1 | 3 | 8 |
| 1 | 3 | 11 |
| 1 | 3 | 18 |
| 1 | 3 | 19 |
| 1 | 3 | 20 |
| 1 | 3 | 21 |
| 1 | 3 | 26 |
| 1 | 3 | 28 |
| 1 | 3 | 32 |
| 1 | 3 | 38 |
| 1 | 3 | 40 |
| 1 | 3 | 41 |
| 1 | 3 | 42 |

TABLE 2A-continued

Inter-Band Carrier Aggregation Combinations of 3 Bands

| First Band | Second Band | Third Band |
|---|---|---|
| 1 | 3 | 43 |
| 1 | 5 | 7 |
| 1 | 5 | 40 |
| 1 | 5 | 41 |
| 1 | 5 | 46 |
| 1 | 7 | 8 |
| 1 | 7 | 20 |
| 1 | 7 | 26 |
| 1 | 7 | 28 |
| 1 | 7 | 32 |
| 1 | 7 | 40 |
| 1 | 7 | 42 |
| 1 | 7 | 46 |
| 1 | 8 | 11 |
| 1 | 8 | 20 |
| 1 | 8 | 28 |
| 1 | 8 | 38 |
| 1 | 8 | 40 |
| 1 | 11 | 18 |
| 1 | 11 | 28 |
| 1 | 18 | 28 |
| 1 | 19 | 21 |
| 1 | 19 | 28 |
| 1 | 19 | 42 |
| 1 | 20 | 28 |
| 1 | 20 | 32 |
| 1 | 20 | 42 |
| 1 | 20 | 43 |
| 1 | 21 | 28 |
| 1 | 21 | 42 |
| 1 | 28 | 42 |
| 1 | 32 | 42 |
| 1 | 32 | 43 |
| 1 | 41 | 42 |
| 1 | 42 | 43 |
| 2 | 4 | 5 |
| 2 | 4 | 7 |
| 2 | 4 | 12 |
| 2 | 4 | 13 |
| 2 | 4 | 28 |
| 2 | 4 | 29 |
| 2 | 4 | 30 |
| 2 | 4 | 71 |
| 2 | 5 | 7 |
| 2 | 5 | 12 |
| 2 | 5 | 13 |
| 2 | 5 | 28 |
| 2 | 5 | 29 |
| 2 | 5 | 30 |
| 2 | 5 | 46 |
| 2 | 5 | 66 |
| 2 | 7 | 12 |
| 2 | 7 | 28 |
| 2 | 7 | 30 |
| 2 | 7 | 46 |
| 2 | 7 | 66 |
| 2 | 12 | 30 |
| 2 | 12 | 66 |
| 2 | 13 | 46 |
| 2 | 13 | 48 |
| 2 | 13 | 66 |
| 2 | 14 | 30 |
| 2 | 14 | 66 |
| 2 | 29 | 30 |
| 2 | 29 | 66 |
| 2 | 30 | 66 |
| 2 | 46 | 48 |
| 2 | 46 | 66 |
| 2 | 48 | 66 |
| 2 | 66 | 71 |
| 3 | 5 | 7 |
| 3 | 5 | 40 |
| 3 | 5 | 41 |
| 3 | 7 | 8 |
| 3 | 7 | 20 |
| 3 | 7 | 26 |
| 3 | 7 | 28 |
| 3 | 7 | 32 |
| 3 | 7 | 38 |
| 3 | 7 | 40 |
| 3 | 7 | 42 |
| 3 | 7 | 46 |
| 3 | 8 | 11 |
| 3 | 8 | 20 |
| 3 | 8 | 28 |
| 3 | 8 | 32 |
| 3 | 8 | 38 |
| 3 | 8 | 40 |
| 3 | 11 | 18 |
| 3 | 11 | 26 |
| 3 | 11 | 28 |
| 3 | 19 | 21 |
| 3 | 19 | 42 |
| 3 | 20 | 28 |
| 3 | 20 | 32 |
| 3 | 20 | 42 |
| 3 | 20 | 43 |
| 3 | 21 | 28 |
| 3 | 21 | 42 |

TABLE 2B

Inter-Band Carrier Aggregation Combinations of 3 Bands (continued)

| First Band | Second Band | Third Band |
|---|---|---|
| 3 | 28 | 38 |
| 3 | 28 | 40 |
| 3 | 28 | 41 |
| 3 | 28 | 42 |
| 3 | 32 | 42 |
| 3 | 32 | 43 |
| 3 | 41 | 42 |
| 3 | 42 | 43 |
| 4 | 5 | 12 |
| 4 | 5 | 13 |
| 4 | 5 | 29 |
| 4 | 5 | 30 |
| 4 | 7 | 12 |
| 4 | 7 | 28 |
| 4 | 12 | 30 |
| 4 | 23 | 30 |
| 5 | 7 | 28 |
| 5 | 7 | 46 |
| 5 | 12 | 46 |
| 5 | 12 | 48 |
| 5 | 12 | 66 |
| 5 | 30 | 66 |
| 5 | 40 | 41 |
| 5 | 46 | 66 |
| 7 | 8 | 20 |
| 7 | 8 | 38 |
| 7 | 8 | 40 |
| 7 | 12 | 66 |
| 7 | 20 | 28 |
| 7 | 20 | 32 |
| 7 | 20 | 38 |
| 7 | 20 | 42 |
| 7 | 28 | 38 |
| 7 | 30 | 66 |
| 7 | 46 | 66 |
| 8 | 11 | 28 |
| 8 | 20 | 28 |
| 8 | 28 | 41 |
| 8 | 33 | 41 |
| 12 | 30 | 66 |

TABLE 2B-continued

Inter-Band Carrier Aggregation Combinations of 3 Bands (continued)

| First Band | Second Band | Third Band |
|---|---|---|
| 13 | 46 | 66 |
| 13 | 48 | 66 |
| 14 | 30 | 66 |
| 13 | 21 | 42 |
| 20 | 32 | 42 |
| 20 | 32 | 43 |
| 20 | 38 | 40 |
| 21 | 28 | 42 |
| 25 | 26 | 41 |
| 28 | 41 | 42 |
| 23 | 30 | 66 |
| 23 | 46 | 66 |
| 23 | 66 | 70 |
| 32 | 42 | 43 |
| 46 | 48 | 66 |
| 46 | 48 | 71 |
| 66 | 70 | 71 |

Multiplexers disclosed herein can implement inter-band carrier aggregations with four different bands. For example, an octoplexer in accordance with any suitable principles and advantages disclosed herein can support four band carrier aggregations with any suitable LTE band combinations included in Table 3.

TABLE 3

Inter-Band Carrier Aggregation Combinations of 4 Bands

| First Band | Second Band | Third Band | Fourth Band |
|---|---|---|---|
| 1 | 3 | 5 | 7 |
| 1 | 3 | 5 | 40 |
| 1 | 3 | 5 | 41 |
| 1 | 3 | 7 | 8 |
| 1 | 3 | 7 | 20 |
| 1 | 3 | 7 | 26 |
| 1 | 3 | 7 | 28 |
| 1 | 3 | 7 | 32 |
| 1 | 3 | 7 | 40 |
| 1 | 3 | 7 | 42 |
| 1 | 3 | 8 | 11 |
| 1 | 3 | 8 | 20 |
| 1 | 3 | 8 | 28 |
| 1 | 3 | 8 | 38 |
| 1 | 3 | 8 | 40 |
| 1 | 3 | 11 | 28 |
| 1 | 3 | 19 | 21 |
| 1 | 3 | 19 | 42 |
| 1 | 3 | 20 | 28 |
| 1 | 3 | 20 | 32 |
| 1 | 3 | 20 | 42 |
| 1 | 3 | 20 | 43 |
| 1 | 3 | 21 | 28 |
| 1 | 3 | 21 | 42 |
| 1 | 3 | 28 | 42 |
| 1 | 3 | 32 | 42 |
| 1 | 3 | 32 | 43 |
| 1 | 3 | 42 | 43 |
| 1 | 5 | 7 | 46 |
| 1 | 7 | 8 | 20 |
| 1 | 7 | 8 | 40 |
| 1 | 7 | 20 | 28 |
| 1 | 7 | 20 | 32 |
| 1 | 7 | 20 | 42 |
| 1 | 8 | 11 | 28 |
| 1 | 8 | 20 | 28 |
| 1 | 19 | 21 | 42 |
| 1 | 20 | 32 | 42 |
| 1 | 20 | 32 | 43 |
| 1 | 21 | 28 | 42 |

TABLE 3-continued

Inter-Band Carrier Aggregation Combinations of 4 Bands

| First Band | Second Band | Third Band | Fourth Band |
|---|---|---|---|
| 1 | 32 | 42 | 43 |
| 2 | 4 | 5 | 12 |
| 2 | 4 | 5 | 29 |
| 2 | 4 | 5 | 30 |
| 2 | 4 | 7 | 12 |
| 2 | 4 | 12 | 30 |
| 2 | 4 | 29 | 30 |
| 2 | 5 | 7 | 28 |
| 2 | 5 | 12 | 66 |
| 2 | 5 | 30 | 66 |
| 2 | 7 | 12 | 66 |
| 2 | 7 | 46 | 66 |
| 2 | 12 | 30 | 66 |
| 2 | 13 | 48 | 66 |
| 2 | 14 | 30 | 66 |
| 2 | 29 | 30 | 66 |
| 2 | 46 | 48 | 66 |
| 3 | 7 | 8 | 20 |
| 3 | 7 | 8 | 38 |
| 3 | 7 | 8 | 40 |
| 3 | 7 | 20 | 28 |
| 3 | 7 | 20 | 32 |
| 3 | 7 | 20 | 42 |
| 3 | 7 | 28 | 38 |
| 3 | 8 | 11 | 28 |
| 3 | 8 | 20 | 28 |
| 3 | 19 | 21 | 42 |
| 3 | 20 | 32 | 42 |
| 3 | 20 | 32 | 43 |
| 3 | 21 | 28 | 42 |
| 3 | 28 | 41 | 42 |
| 3 | 32 | 42 | 43 |

A multiplexer including any suitable combination of features disclosed herein can include one or more filters arranged to filter a radio frequency signal in a fifth generation (5G) New Radio (NR) operating band within Frequency Range 1 (FR1). FR1 can be from 410 MHz to 7.125 GHz, for example, as specified in a current 5G NR specification. A multiplexer in accordance with any suitable principles and advantages disclosed herein can support any suitable 5G NR carrier aggregations within FR1. A multiplexer with a filter having a relatively high gamma in a passband of one or more other filters of the multiplexer can be advantageous for meeting specifications related to 5G NR technology. As one example, such a multiplexer can be advantageous for 5G NR carrier aggregation applications. In 5G applications, the thermal dissipation of MPS acoustic wave resonators in filters of multiplexers disclosed herein can be advantageous. One or more acoustic wave filters in multiplexers disclosed herein can have a passband that includes a 4G LTE operating band and a 5G NR operating band.

Figure 11A:
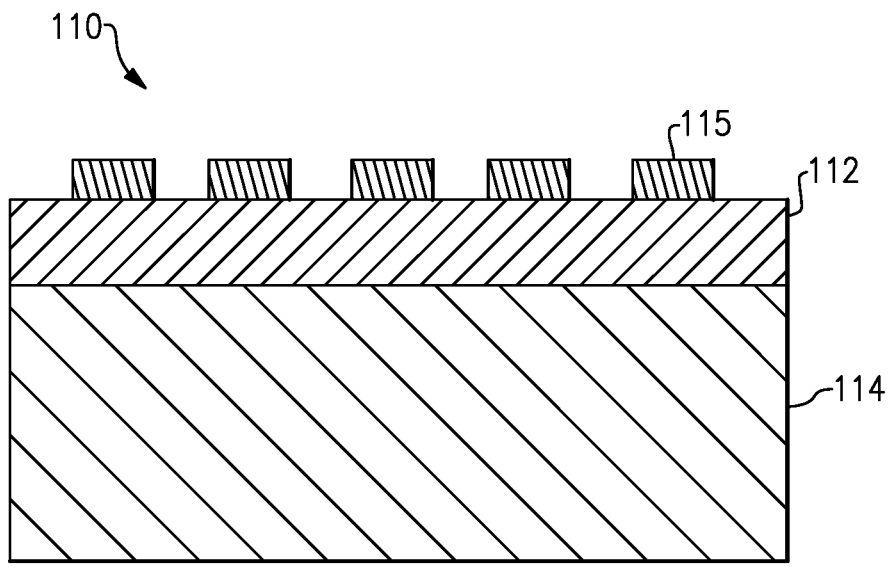
FIG. 11A is a cross sectional view of an MPS SAW resonator according to an embodiment.

FIG. 11A is a cross sectional view of a multilayer piezoelectric substrate (MPS) SAW resonator 110 according to an embodiment. The MPS SAW resonator 110 is an example of a resonator of the MPS filters disclosed herein. The MPS filters disclosed herein can include any suitable number of MPS SAW resonators, such as the MPS SAW resonator 110. The illustrated MPS SAW resonator 110 includes a multilayer piezoelectric substrate includes a piezoelectric substrate 112 and a support substrate 114. The piezoelectric substrate 112 can be a lithium niobate substrate or a lithium tantalate substrate, for example. In certain instances, the piezoelectric layer 114 can have a thickness of less than $\lambda$, in which $\lambda$ is a wavelength of a surface acoustic wave generated by the MPS SAW resonator 110. In some other instances, the piezoelectric layer 114 can have a thickness on the order of 10s of λ, in which λ is a wavelength of a surface acoustic wave generated by the MPS SAW resonator 110. The thickness of the piezoelectric layer 114 can be in a range from about 20 microns to 30 microns in certain applications. The support substrate 114 can be a silicon substrate, a quartz substrate, a sapphire substrate, a polycrystalline spinel substrate, or any other suitable carrier substrate. As one example, the MPS SAW resonator 110 can include a piezoelectric substrate 112 that is lithium tantalate and a support substrate 114 that is silicon. The MPS SAW resonator 110 also includes an interdigital transducer (IDT) electrode 115 on the piezoelectric substrate 112.

In some instances, one or more additional layers can be included in the multilayer piezoelectric substrate. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a lithium tantalate layer over a silicon dioxide layer over an aluminum nitride layer over a silicon layer. As one more illustrative example, a multilayer piezoelectric substrate can include a lithium niobate layer over a silicon dioxide layer over a high impedance layer, in which the high impedance layer has a higher acoustic impedance than the lithium niobate layer.

In some instances, a temperature compensation layer can be implemented over the IDT electrode 115. Such a temperature compensation layer can bring the temperature coefficient of frequency of the MPS SAW resonator closer to zero. As an example, a silicon dioxide layer can implement a temperature compensation layer.

Figure 11B:
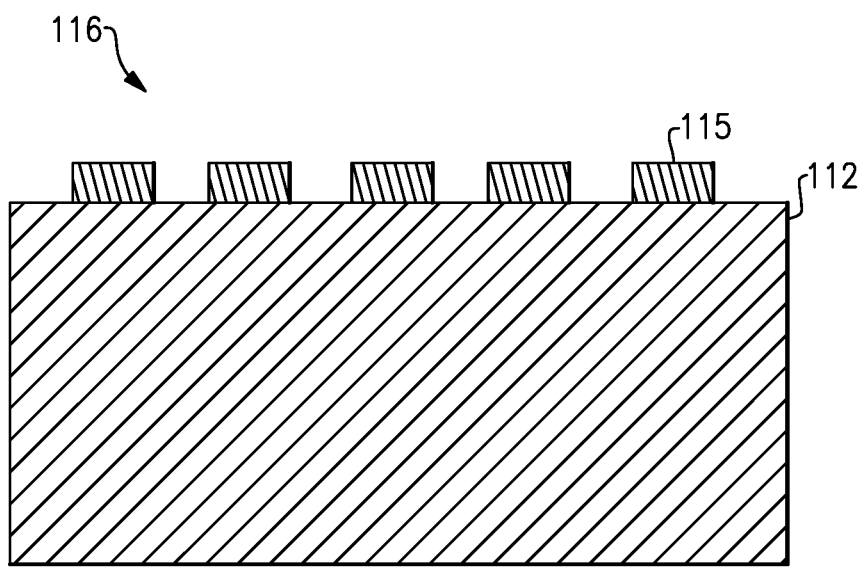
FIG. 11B is a cross sectional view of a SAW resonator according to an embodiment.

FIG. 11B is a cross sectional view of a SAW resonator 116 according to an embodiment. The SAW resonator 116 is an example of a resonator of SAW filters disclosed herein. The SAW resonator 116 is an example of a non-temperature compensated SAW resonator. In certain applications, SAW filters disclosed herein can include any suitable number of non-temperature compensated SAW resonators, such as the SAW resonator 116. The illustrated SAW resonator 116 includes a piezoelectric substrate 112 and an IDT electrode 115 on the piezoelectric substrate 112. The piezoelectric substrate 112 can be a lithium niobate substrate or a lithium tantalate substrate, for example.

Figure 11C:
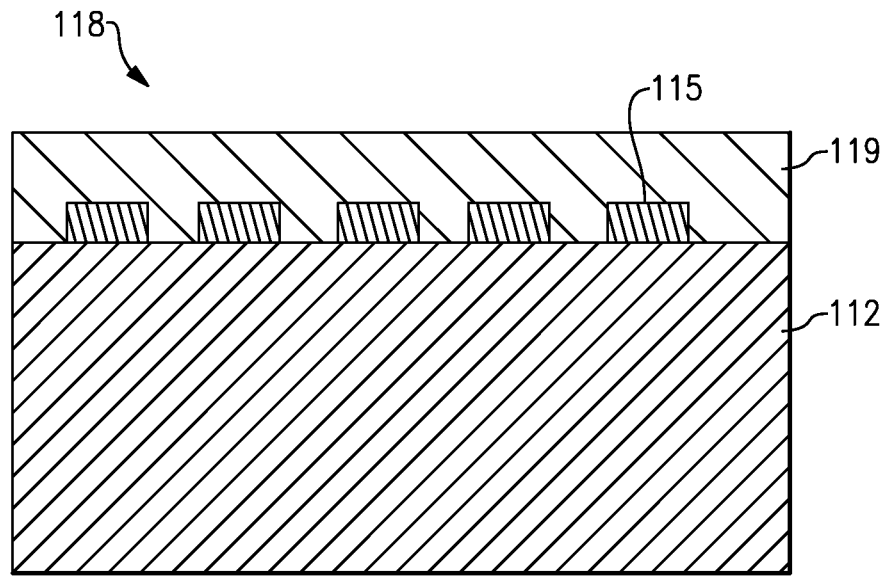
FIG. 11C is a cross sectional view of a temperature compensated SAW resonator according to an embodiment.

FIG. 11C is a cross sectional view of a TCSAW resonator 118 according to an embodiment. The TCSAW resonator 118 is an example of a resonator of TCSAW filters disclosed herein. In certain applications, TCSAW filters disclosed herein can include any suitable number of TCSAW resonators, such as the TCSAW resonator 118. The illustrated TC SAW resonator 118 includes a piezoelectric substrate 112, an IDT electrode 115 on the piezoelectric substrate 112, and a temperature compensation layer 119 over the IDT electrode 115. The piezoelectric substrate 112 can be a lithium niobate substrate or a lithium tantalate substrate, for example.

The temperature compensation layer 119 can bring the temperature coefficient of frequency (TCF) of the TCSAW resonator 118 closer to zero relative to a similar SAW resonator without the temperature compensation layer 119. The temperature compensation layer 119 can have a positive TCF. This can compensate for the piezoelectric substrate 112 having a negative TCF. The temperature compensation layer 119 can be a silicon dioxide ($SiO_2$) layer. The temperature compensation layer 119 can be any other suitable temperature compensating material including without limitation a tellurium dioxide ($TeO_2$) layer or a silicon oxyfluoride (SiOF layer). The temperature compensation layer 119 can include any suitable combination of $SiO_2$, $TeO_2$, and/or SiOF.

Figure 12:
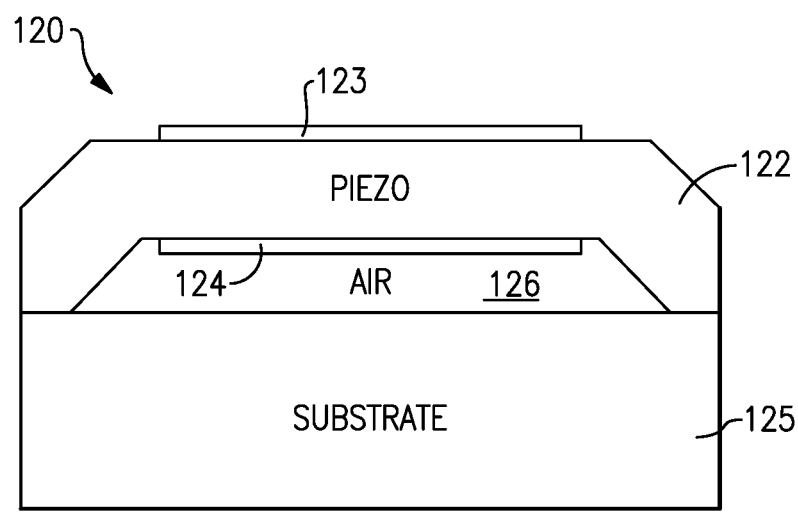
FIG. 12 is a cross sectional view of a bulk acoustic wave resonator according to an embodiment.

FIG. 12 is a cross sectional view of a BAW resonator 120 according to an embodiment. The BAW resonator 120 is an example of a resonator of BAW filters disclosed herein. In certain applications, BAW filters disclosed herein can include any suitable number of BAW resonators, such as the BAW resonator 120. The BAW resonator 120 is an FBAR. The BAW resonator 120 can be a type II BAW resonator.

As illustrated, the BAW resonator 120 includes a piezoelectric layer 122, a first electrode 123, and a second electrode 124, a support substrate 125, and an air gap 126. The piezoelectric layer 122 is disposed between the first electrode 123 and the second electrode 124. The piezoelectric layer 122 can be an aluminum nitride (AlN) layer or any other suitable piezoelectric layer. An active region or active domain of the BAW resonator 120 is defined by the portion of the piezoelectric layer 122 that overlaps with both the first electrode 123 and the second electrode 124. The first electrode 123 can have a relatively high acoustic impedance. For example, the first electrode 123 can include molybdenum, tungsten, ruthenium, iridium, platinum, copper, gold, or any suitable combination thereof. Similarly, the second electrode 124 can have a relatively high acoustic impedance. The second electrode 124 can be formed of the same material as the first electrode 123 in certain instances. The air gap 126 is included between the substrate 125 and the second electrode 124. The illustrated air gap 126 is an air cavity above the substrate 125. In some other instances (not illustrated), an air cavity in the substrate 125 can alternatively be implemented. The substrate 125 can be a silicon substrate, for example.

Figure 13:
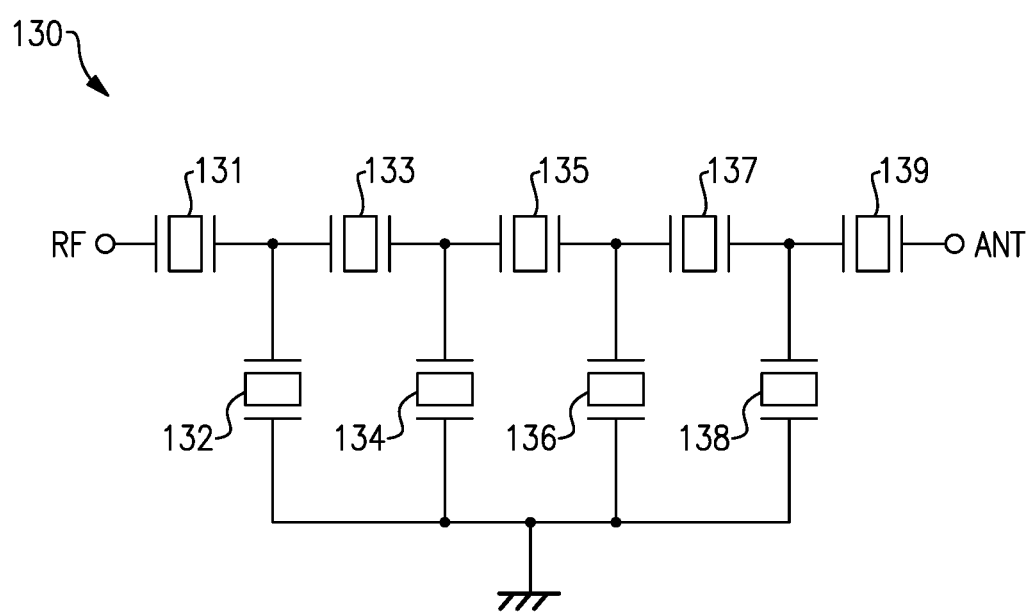
FIG. 13 is a schematic diagram of a ladder filter according to an embodiment.

Acoustic wave filters disclosed herein can have a ladder filter topology. FIG. 13 is a schematic diagram of an example ladder filter 130 according to an embodiment. The ladder filter 130 is an example topology of the band pass filter formed from acoustic wave resonators that can be included in a multiplexer in accordance with any suitable principles and advantages disclosed herein. The ladder filter 130 can be arranged to filter an RF signal. As illustrated, the ladder filter 130 includes series acoustic wave resonators 131, 133, 135, 137, and 139 and shunt acoustic wave resonators 132, 134, 136, and 138 coupled between an RF port RF and an antenna port ANT. The RF port can be a transmit port for a transmit filter or a receive port for a receive filter. Any suitable number of series acoustic resonators can be in included in a ladder filter. Any suitable number of shunt acoustic wave resonators can be included in a ladder filter. Any of the illustrated acoustic wave resonators can be implemented by a plurality of series acoustic wave resonators and/or anti-series acoustic wave resonators and/or shunt acoustic wave resonators.

The multiplexers discussed herein can be implemented in a variety of radio frequency systems. Multiplexers disclosed herein process radio frequency signals having frequencies in a range from about 450 MHz to 6 GHz and/or in a range from about 410 MHz to 7.125 GHz. In certain applications, multiplexers disclosed herein can filter radio frequency signals at up to about 10 GHz. Some radio frequency systems that include multiplexers in accordance with the principles and advantages discussed herein are configured to process carrier aggregation signals. In radio frequency systems with carrier aggregation, multiple filters can be arranged as a multiplexer and connected to a common antenna node. Some example radio frequency systems will be discussed with reference to FIGS. 14, 15, 16, 17A, and 17B in which any suitable principles and advantages of the multiplexers disclosed herein can be implemented.

Figure 14:
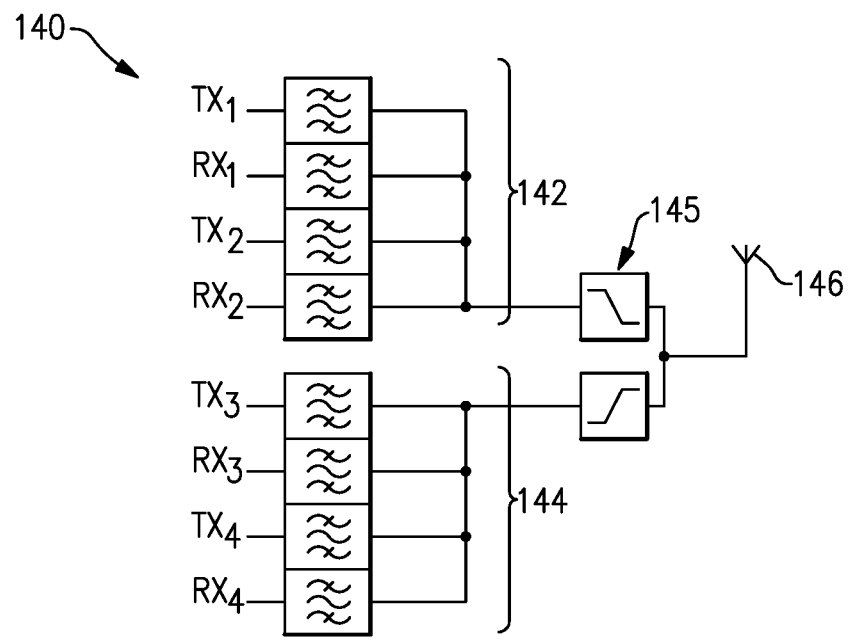
FIG. 14 is a schematic diagram of a radio frequency system that includes quadplexers coupled to an antenna by way of a diplexer.

FIG. 14 is a schematic diagram of a radio frequency system 140 that includes quadplexers 142 and 144 coupled to an antenna 146 by way of a diplexer 146. The first quadplexer 142 and/or the second quadplexer 144 can be implemented in accordance with any suitable principles and advantages of the multiplexers disclosed herein. In FIG. 14, a first quadplexer 142 includes four acoustic wave filters each arranged as a band pass filter configured to filter a radio frequency signal. The four acoustic wave filters include two transmit filters and two receive filters. In FIG. 14, a second quadplexer 144 also includes four acoustic wave filters similar to the acoustic wave filters of the first quadplexer 142 but associated with different frequency bands. The diplexer 145 can frequency multiplex radio frequency signals propagating between the illustrated quadplexers 142 and 144 and the antenna 146. The diplexer 146 can allow lower frequency signals to propagate between the first quadplexer 142 and the antenna 146, and the diplexer 145 can allow higher frequency signals to propagate between the second quadplexer 144 and the antenna 146.

Figure 15:
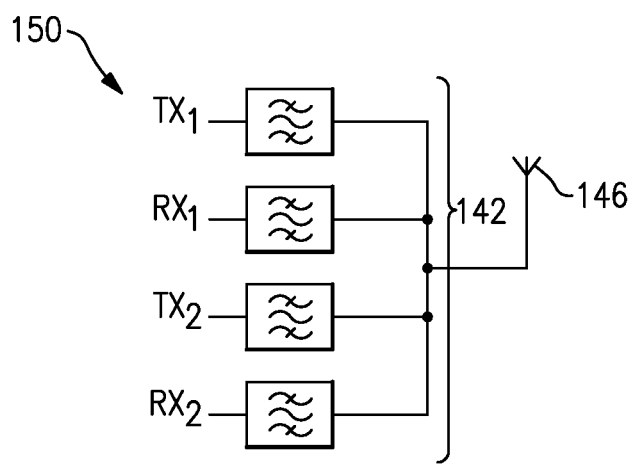
FIG. 15 is a schematic diagram of a radio frequency system that includes a quadplexer coupled to an antenna.

FIG. 15 is a schematic diagram of a radio frequency system 150 that includes a quadplexer 142 coupled to an antenna 146. FIG. 15 illustrates that a multiplexer in accordance with any suitable principles and advantages disclosed herein can be connected to an antenna without an intervening frequency multiplexing circuit (e.g., a diplexer or a triplexer) in some applications. For instance, when a carrier aggregation signal includes two carriers that are relatively close in frequency, a diplexer or a triplexer can be relatively difficult and/or expensive to implement and/or have relatively high loss. In such circumstances, filters can be connected together at a common node as a multiplexer. As one example, such a multiplexer can be a quadplexer with transmit and receive filters for Band 25 and Band 66. A multiplexer can be connected to an antenna without an intervening switch or frequency multiplexing circuit in certain applications, as shown in FIG. 15. For instance, a mobile phone configured for wireless communication of a carrier aggregation signal with only two carrier aggregation bands can include a multiplexer having a multiplexer connected to an antenna without any intervening switch or frequency multiplexing circuit.

Figure 16:
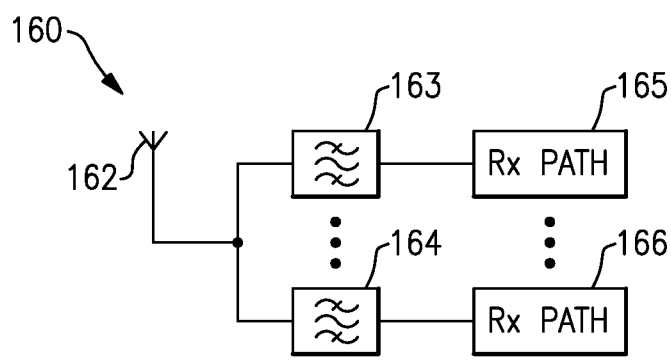
FIG. 16 is a schematic diagram of a radio frequency system that includes an antenna coupled to receive paths by way of a multiplexer.

FIG. 16 is a schematic diagram of a radio frequency system 160 that includes an antenna 162 coupled to receive paths 165 and 166 by way of a multiplexer. In some instances, a radio can be implemented for diversity receive operations. A diversity antenna, such as the illustrated antenna 162, can provide a received radio frequency signal to several receive paths. A multiplexer in accordance with any suitable principles and advantages disclosed herein can be coupled between a plurality of receive paths 165 and 166 and the diversity antenna 162. As shown in FIG. 16, a multiplexer (e.g., a quadplexer) including receive filters 163 and 164 can be coupled between receive paths 165 and 164, respectively, and the antenna 162. Any suitable number of receive paths and corresponding receive filters can be implemented for a particular implementation. For instance, 4 or more receive filters can be included in a multiplexer and respective receive paths in some instances. In some embodiments (not illustrated), a switch can be coupled between a multiplexer and a diversity antenna and/or a switch can be coupled between receive paths and a receive filter of the multiplexer.

FIG. 17A is a schematic diagram of a radio frequency system 170 that includes multiplexers in signal paths between power amplifiers and an antenna. The illustrated radio frequency system 170 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz. Any of the multiplexers 173, 176, and 179 of the radio frequency system 170 can be implemented in accordance with any suitable principles and advantages disclosed herein.

A frequency multiplexing circuit, such as a diplexer 145, can be included between signal paths and the antenna 146. Such a frequency multiplexing circuit can serve as a frequency splitter for receive paths and a frequency combiner for transmit paths. The diplexer 145 can frequency multiplex radio frequency signals that are relatively far away in frequency. The diplexer 145 can be implemented with passive circuit elements having a relatively low loss. The diplexer 145 can combine (for transmit) and separate (for receive) carrier aggregation signals.

As illustrated, the low band path includes a power amplifier 171 configured to amplify a low band radio frequency signal, a band select switch 172, and a multiplexer 173. The band select switch 172 can electrically connect the output of the power amplifier 171 to a selected transmit filter of the multiplexer 173. The selected transmit filter can be a band pass filter with a pass band corresponding to a frequency of an output signal of the power amplifier 171. The multiplexer 173 can include any suitable number of transmit filters and any suitable number of receive filters. The multiplexer 173 can have the same number of transmit filters as receive filters in certain applications. In some instances, the multiplexer 173 can have a different number of transmit filters than receive filters.

As illustrated in FIG. 17A, the medium band path includes a power amplifier 174 configured to amplify a medium band radio frequency signal, a band select switch 175, and a multiplexer 176. The band select switch 175 can electrically connect the output of the power amplifier 174 to a selected transmit filter of the multiplexer 176. The selected transmit filter can be a band pass filter with a pass band corresponding to a frequency of an output signal of the power amplifier 174. The multiplexer 176 can include any suitable number of transmit filters and any suitable number of receive filters. The multiplexer 176 can have the same number of transmit filters as receive filters in certain applications. In some instances, the multiplexer 176 can have a different number of transmit filters than receive filters.

In the illustrated radio frequency system 170, the high band path includes a power amplifier 177 configured to amplify a high band radio frequency signal, a band select switch 178, and a multiplexer 179. The band select switch 178 can electrically connect the output of the power amplifier 177 to a selected transmit filter of the multiplexer 179. The selected transmit filter can be a band pass filter with pass band corresponding to a frequency of an output signal of the power amplifier 177. The multiplexer 179 can include any suitable number of transmit filters and any suitable number of receive filters. The multiplexer 179 can have the same number of transmit filters as receive filters in certain applications. In some instances, the multiplexer 179 can have a different number of transmit filters than receive filters.

A select switch 180 can selectively provide a radio frequency signal from the medium band path or the high band path to the diplexer 145. Accordingly, the radio frequency system 170 can process carrier aggregation signals with either a low band and high band combination or a low band and medium band combination.

Figure 17B:
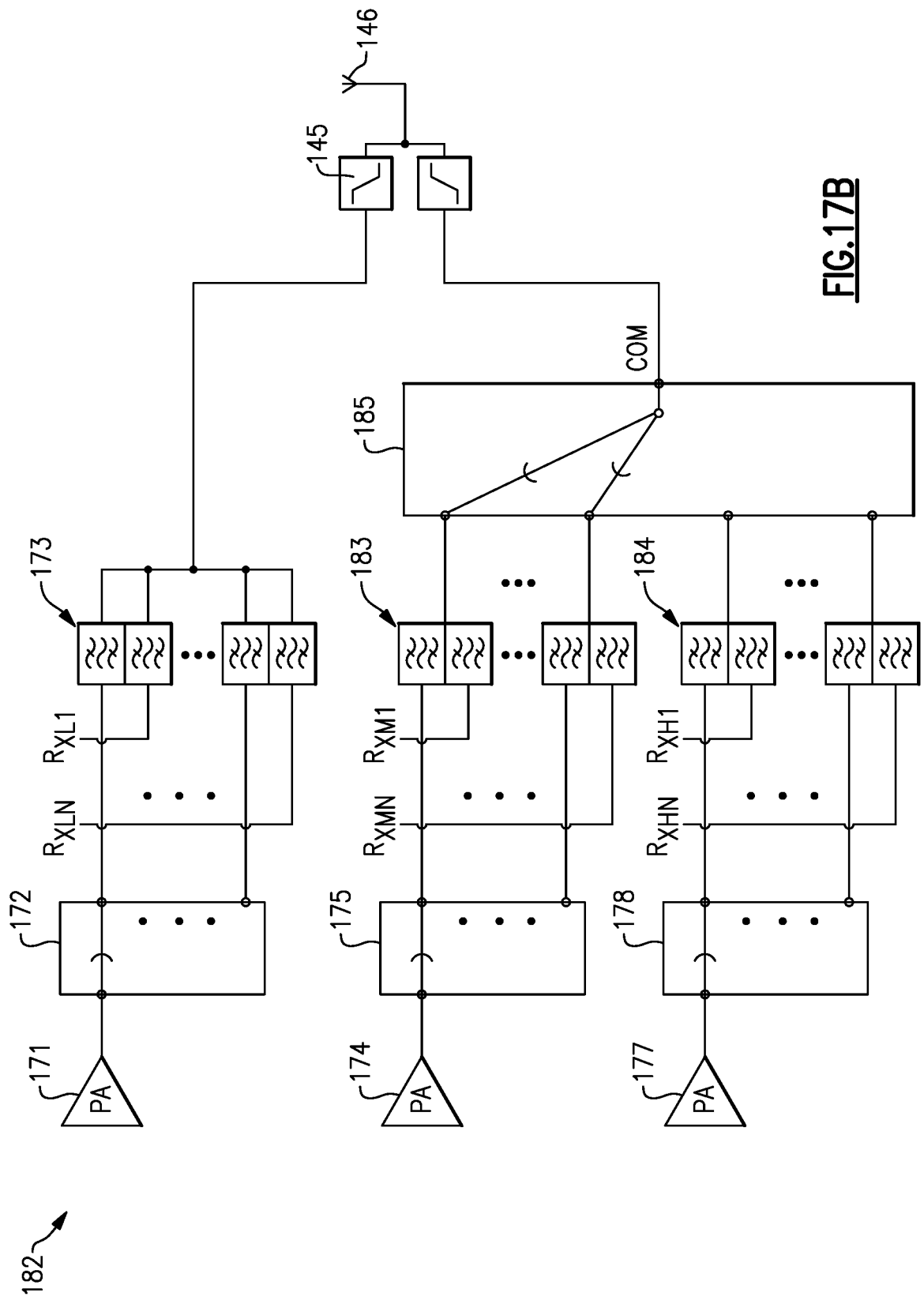
FIG. 17B is a schematic diagram of another radio frequency system that includes multiplexers in signal paths between power amplifiers and an antenna.

FIG. 17B is a schematic diagram of another radio frequency system 182 that includes multiplexers in signal paths between power amplifiers and an antenna. Any of the multiplexers 173, 183, and 184 of the radio frequency system 170 can be implemented in accordance with any suitable principles and advantages disclosed herein. The radio frequency system 182 is like the radio frequency system 170 of FIG. 17A, except that the radio frequency system 182 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a larger number of filters included in multiplexer.

In the illustrated radio frequency system 182, multiplexers 183 and 184 are coupled to a diplexer 176 by way of a switch 185. The switch 185 is configured as a multi-close switch that can have two or more throws active concurrently. Having multiple throws of the switch 185 active concurrently can enable transmission and/or reception of carrier aggregation signals. The switch 185 can also have a single throw active during a single carrier mode. As illustrated, the multiplexer 183 includes a plurality of duplexers coupled to separate throws of the switch 185. Similarly, the illustrated multiplexer 184 includes a plurality of duplexers coupled to separate throws of the switch 185. Alternatively, instead of duplexers being coupled to each throw the switch 185 as illustrated in FIG. 17B, one or more individual filters of a multiplexer can be coupled to a dedicated throw of a switch coupled between the individual filters and a common node. For instance, in some applications, such a switch could have twice as many throws as the illustrated switch 185.

The switch 185 is coupled between filters of the multiplexers 183 and 184, respectively, and a common node COM. FIG. 17B illustrates that less than all of the filters of a multiplexer can be electrically connected to the common node concurrently.

In some instances, two or more throws of a switch coupled between a power amplifier and a multiplexer can be active concurrently. For example, in the radio frequency system 182, two or more throws of the band select switch 175 and/or the band select switch 178 can be active concurrently in certain embodiments.

Figure 18A:
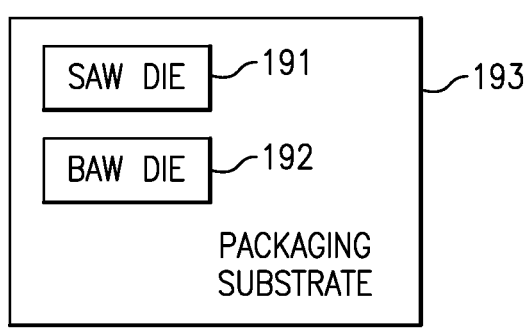
FIG. 18A is a block diagram that illustrates different die that include acoustic wave resonators of filters of a multiplexer according to an embodiment.

FIG. 18A is a block diagram of a filter assembly 190 with different die that include acoustic wave resonators of filters according to an embodiment. As illustrated, the filter assembly 190 includes a SAW die 191 and a BAW die 192 that are included on a common substrate 193. A multiplexer in accordance with any suitable principles and advantages disclosed herein can include one filter with SAW resonators implemented on the SAW die 191 and another filter with BAW resonators implemented on the BAW die 192. The BAW resonators can be FBARs according to certain embodiments. The BAW resonators can be type II BAW resonators. The SAW resonators can be MPS SAW resonators in certain embodiments. According to some other embodiments, the SAW resonators can include TCSAW resonators and/or non-temperature compensated SAW resonators. The substrate 193 can be a laminate substrate or any other suitable packaging substrate.

In certain instances, the BAW die 192 includes a single filter and the SAW die 191 includes a single filter. As one example, BAW resonators of the BAW die 192 can be arranged as the BAW filter 12 of the duplexer 10 of FIG. 1A and MPS SAW resonators of the SAW die 191 can be arranged as the MPS filter 14 of the duplexer 10 of FIG. 1A. In some other instances, the BAW die 192 includes a single filter and the SAW die 191 includes two or more filters. For example, BAW resonators of the BAW die 192 can be arranged as the BAW filter 22 of the quadplexer 73 of FIG. 7B and MPS SAW resonators of the SAW die 191 can be arranged as at least two of the MPS filters 26, 28, and 74 of the quadplexer 73 of FIG. 7B.

Figure 18B:
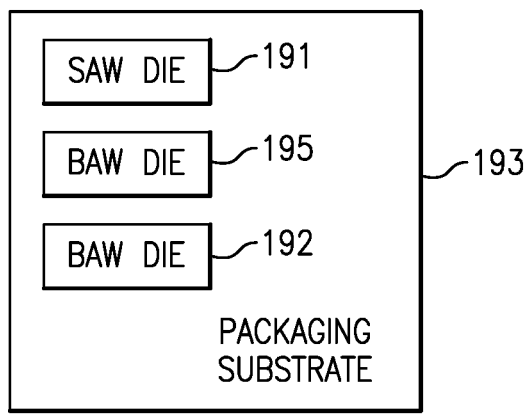
FIG. 18B is a block diagram that illustrates different die that include acoustic wave resonators of filters of a multiplexer according to an embodiment.

FIG. 18B is a block diagram of a filter assembly 194 with different die that include acoustic wave resonators of filters according to an embodiment. As illustrated, the filter assembly 194 includes a SAW die 191, a first BAW die 192, and a second BAW die 195 on a common substrate 193. A multiplexer in accordance with any suitable principles and advantages disclosed herein can include filters implemented on the SAW die 191, the first BAW die 192, and the second BAW die 195. For example, a triplexer can include a first filter on the first BAW die 192, a second filter on the second BAW die 195, and a third filter on the SAW die 191. In this example, the first filter can have the lowest passband and the third filter can have the highest passband. As another example, a quadplexer can include a first filter on the first BAW die 192, a second filter on the second BAW die 195, a third filter on the SAW die 191, and a fourth filter on the SAW die 191. In this example, the first filter can have the lowest passband, the second filter can have the next lowest passband, the third filter can have the next lowest passband, and the fourth filter can have the highest passband. Such a quadplexer can implement any suitable combination of features of the quadplexer 20 of FIG. 2A and/or the quadplexer 90 of FIG. 9A.

Figure 18C:
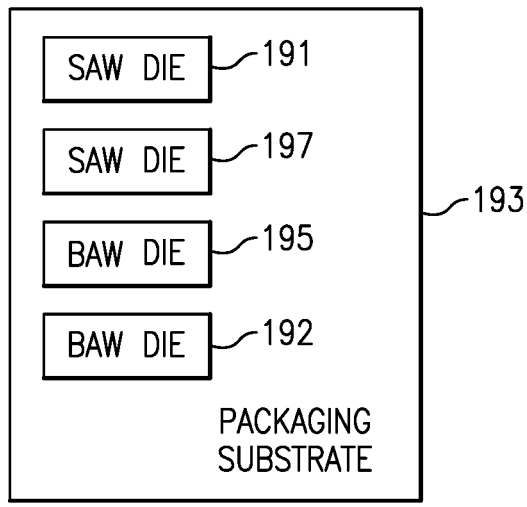
FIG. 18C is a block diagram that illustrates different die that include acoustic wave resonators of filters of a multiplexer according to an embodiment.

FIG. 18C is a block diagram of a filter assembly 196 with different die that include acoustic wave resonators of filters according to an embodiment. As illustrated, the filter assembly 196 includes a first SAW die 191, a second SAW die 197, a first BAW die 192, and a second BAW die 195 on a common substrate 193. A multiplexer in accordance with any suitable principles and advantages disclosed herein can include filters implemented on the first SAW die 191, the second SAW die 197, the first BAW die 192, and the second BAW die 195. For example, a quadplexer can include a first filter on the first BAW die 192, a second filter on the second BAW die 195, a third filter on the first SAW die 191, and a fourth filter on the second SAW die 197. In this example, the first filter can have the lowest passband, the second filter can have the next lowest passband, the third filter can have the next lowest passband, and the fourth filter can have the highest passband. Such a quadplexer can implement any suitable combination of features of the quadplexer 20 of FIG. 2A and/or the quadplexer 90 of FIG. 9A.

Figure 19:
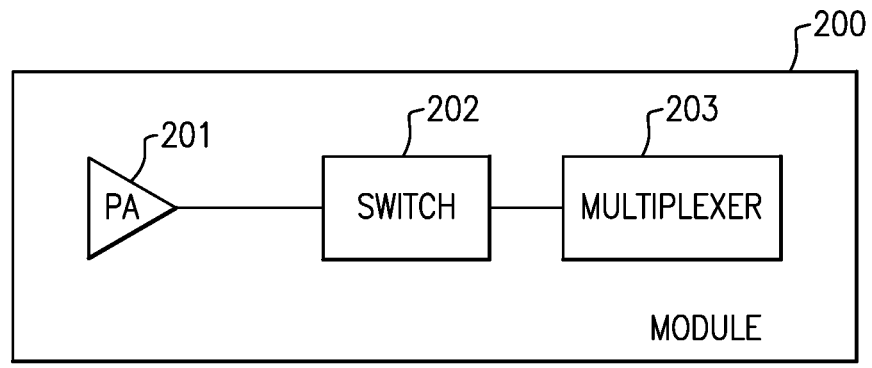
FIG. 19 is a schematic block diagram of a module that includes a power amplifier, a switch, and a multiplexer according to an embodiment.
Figure 20:
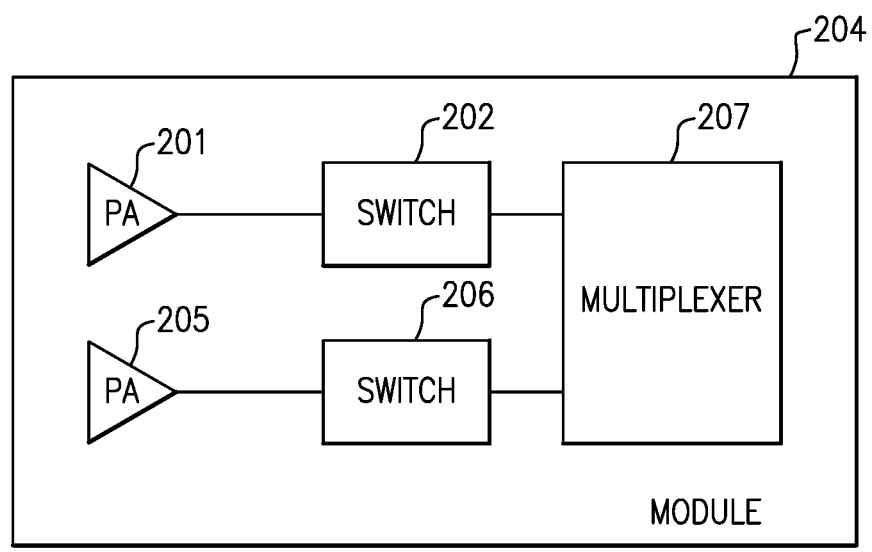
FIG. 20 is a schematic block diagram of a module that includes power amplifiers, switches, and a multiplexer according to an embodiment.

The multiplexers discussed herein can be implemented in a variety of packaged modules. Some example packaged modules will now be discussed in which any suitable principles and advantages of the multiplexers can be implemented. FIGS. 19 and 20 are schematic block diagrams of illustrative packaged modules according to certain embodiments.

FIG. 19 is a schematic block diagram of a module 200 that includes a power amplifier 201, a switch 202, and a multiplexer 203 according to an embodiment. The module 200 can include a package that encloses the illustrated elements. In some instances, the package can enclosed additional circuit elements. The power amplifier 201, the switch 202, and the multiplexer 203 can be disposed on a common packaging substrate. The packaging substrate can be a laminate substrate, for example. The switch 202 can be a multi-throw radio frequency switch. The switch 202 can electrically couple an output of the power amplifier 201 to a selected transmit filter of the multiplexer 203. The switch 202 can electrically couple an input of a low noise amplifier (not illustrated) to a selected receive filter of the multiplexer 203. The low noise amplifier can be included in the module 200 in some instances. According to some other instances, the low noise amplifier can be external to the module 200. The multiplexer 203 can include any suitable features of the multiplexers disclosed herein.

FIG. 20 is a schematic block diagram of a module 204 that includes power amplifiers 201 and 205, switches 202 and 206, and a multiplexer 207 according to an embodiment. The multiplexer 207 can implement any suitable combination of features of the multiplexers disclosed herein. The module 204 is like the module 200 of FIG. 19, except that the module 204 includes an addition power amplifier 204 and an additional switch 206 and the multiplexer 207 can receive signals from the power amplifiers 201 and 205. The switches 202 and 206 can concurrently couple outputs of the power amplifiers 201 and 205, respectively, to different transmit filters of the multiplexer 207. The switches 202 and 206 can concurrently couple inputs of low noise amplifiers (not illustrated) to different receive filters of the multiplexer 207.

Figure 21A:
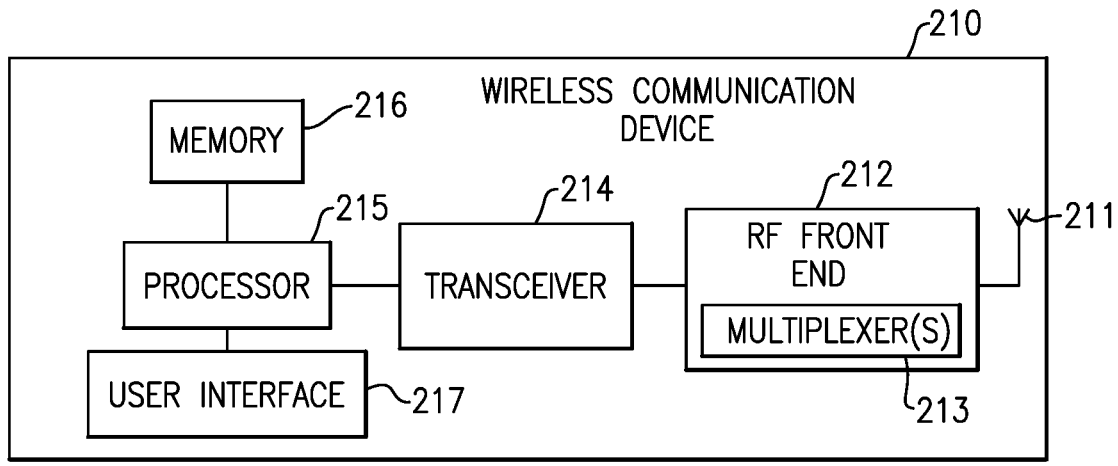
FIG. 21A is a schematic block diagram of a wireless communication device that includes a multiplexer according to an embodiment.

FIG. 21A is a schematic diagram of a wireless communication 210 device that includes multiplexer(s) 213 in a radio frequency front end 212 according to an embodiment. The multiplexer(s) 213 can be implemented in accordance with any suitable principles and advantages discussed herein. The wireless communication device 210 can be any suitable wireless communication device. For instance, a wireless communication device 210 can be a mobile phone, such as a smart phone. As illustrated, the wireless communication device 210 includes an antenna 211, an RF front end 212, a transceiver 214, a processor 215, a memory 216 and a user interface 217. The antenna 211 can transmit RF signals provided by the RF front end 212. Such RF signals can include carrier aggregation signals. The antenna 211 can receive RF signals and provide the received RF signals to the RF front end 212 for processing. Such RF signals can include carrier aggregation signals.

The RF front end 212 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 212 can transmit and receive RF signals associated with any suitable communication standards. The multiplexer(s) 213 can include any suitable combination of features discussed with reference to any embodiments discussed above.

The transceiver 214 can provide RF signals to the RF front end 212 for amplification and/or other processing. The transceiver 214 can also process an RF signal provided by a low noise amplifier of the RF front end 212. The transceiver 214 is in communication with the processor 215. The processor 215 can be a baseband processor. The processor 215 can provide any suitable base band processing functions for the wireless communication device 210. The memory 216 can be accessed by the processor 215. The memory 216 can store any suitable data for the wireless communication device 210. The user interface 217 can be any suitable user interface, such as a display with touch screen capabilities.

Figure 21B:
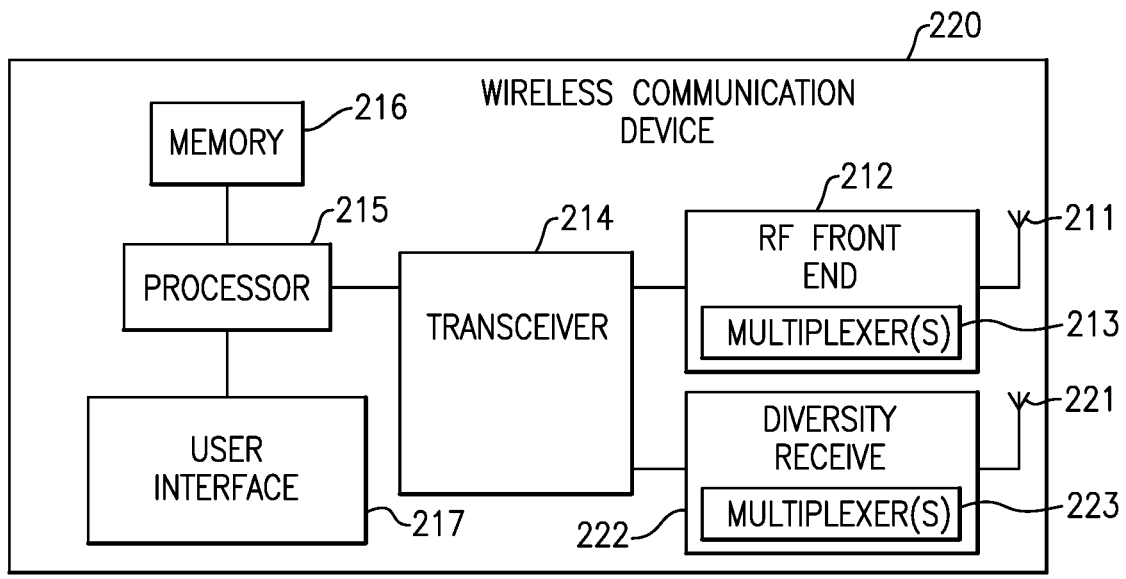
FIG. 21B is a schematic block diagram of a wireless communication device that includes a multiplexer according to an embodiment.

FIG. 21B is a schematic diagram of a wireless communication device 220 that includes multiplexer(s) 213 in a radio frequency front end 212 and second filters 223 in a diversity receive module 222. The wireless communication device 220 is like the wireless communication device 210 of FIG. 21A, except that the wireless communication device 220 also includes diversity receive features. As illustrated in FIG. 21B, the wireless communication device 220 includes a diversity antenna 221, a diversity module 222 configured to process signals received by the diversity antenna 221 and including multiplexer(s) 223, and a transceiver 224 in communication with both the radio frequency front end 212 and the diversity receive module 222. The multiplexer(s) 223 can include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer with acoustic wave filters for filtering radio frequency signals, the multiplexer comprising:
    a first acoustic wave filter having a first pass band, the first acoustic wave filter including bulk acoustic wave resonators having at least a first spurious mode below one or more resonant frequencies of the bulk acoustic wave resonators; and
    a second acoustic wave filter coupled to the first acoustic wave filter at a common node, the second acoustic wave filter having a second pass band with a frequency range above the first pass band, the second pass band associated with a different frequency band than the first pass band, the second acoustic wave filter including multilayer piezoelectric substrate surface acoustic wave resonators having at least a second spurious mode above one or more resonant frequencies of the multilayer piezoelectric substrate surface acoustic wave resonators, the bulk acoustic wave resonators have a substantially constant first gamma in the second pass band, the multilayer piezoelectric substrate surface acoustic wave resonators having a substantially constant second gamma in the first pass band.

2. The multiplexer of claim 1 wherein the first spurious mode is below the first pass band.

3. The multiplexer of claim 1 wherein the bulk acoustic wave resonators have a first gamma of at least 0.9 in the second pass band, and the multilayer piezoelectric substrate surface acoustic wave resonators have a second gamma of at least 0.85 in the first pass band.

4. The multiplexer of claim 3 wherein the bulk acoustic wave resonators have spurious modes below the first pass band.

5. The multiplexer of claim 1 wherein spurious modes of the bulk acoustic wave resonators are outside of the second pass band.

6. The multiplexer of claim 1 further comprising a third acoustic wave filter coupled to the common node and having a third pass band, the third pass band being between the first pass band and the second pass band.

7. The multiplexer of claim 6 wherein the third acoustic wave filter is a bulk acoustic wave filter with one or more bulk acoustic resonators having a third gamma of at least 0.9 in the second pass band.

8. The multiplexer of claim 6 wherein the third acoustic wave filter is a surface acoustic wave filter having a third gamma of at least 0.85 in the first pass band.

9. The multiplexer of claim 6 wherein the third acoustic wave filter is a multilayer piezoelectric substrate surface acoustic wave filter.

10. The multiplexer of claim 1 further comprising:
    a third acoustic wave filter coupled to the common node and having a third pass band, the third acoustic wave filter including second bulk acoustic wave resonators; and
    a fourth acoustic wave filter coupled to the common node and having a fourth pass band, the fourth acoustic wave filter including second multilayer piezoelectric surface acoustic wave resonators, the third pass band being between the first pass band and the fourth pass band, and the fourth pass band being between the third pass band and the second pass band.

11. The multiplexer of claim 1 further comprising:
    a third acoustic wave filter coupled to the common node and having a third pass band; and
    a fourth acoustic wave filter coupled to the common node and having a fourth pass band, the first pass band and the third pass band being associated with a first frequency band, and the second pass band and the fourth pass band being associated with a second frequency band, and the common node configured to receive a carrier aggregation signal including carriers associated with the first frequency band and the second frequency band.

12. The multiplexer of claim 1 further comprising two additional acoustic wave filters coupled to the common node, the first pass band being a lowest pass band of all acoustic wave filters of the multiplexer, and the second pass band being a highest pass band of all acoustic wave filters of the multiplexer.

13. The multiplexer of claim 1 further comprising four additional acoustic wave filters coupled to the common node, the first pass band being a lowest pass band of all acoustic wave filters of the multiplexer, and the second pass band being a highest pass band of all acoustic wave filters of the multiplexer.

14. An acoustic wave filter assembly comprising:
    a bulk acoustic wave die on a substrate, the bulk acoustic wave die including bulk acoustic wave resonators arranged as a first filter having a first pass band, the bulk acoustic wave resonators having at least a first spurious mode below one or more resonant frequencies of the bulk acoustic wave resonators; and
    a multilayer piezoelectric substrate die on the substrate, the multilayer piezoelectric substrate die including multilayer piezoelectric substrate surface acoustic wave resonators arranged as a second filter having a second pass band with at least a second spurious mode above one or more resonant frequencies of the multilayer piezoelectric substrate surface acoustic wave resonators, the second filter coupled to the first filter at a common node, the second pass band associated with a different frequency band than the first pass band, and the bulk acoustic wave resonators have a substantially constant first gamma in the second pass band, the multilayer piezoelectric substrate surface acoustic wave resonators having a substantially constant second gamma in the first pass band.

15. The acoustic wave filter assembly of claim 14 further comprising a package enclosing the bulk acoustic wave die and the multilayer piezoelectric substrate die.

16. The acoustic wave filter assembly of claim 14 further comprising a surface acoustic wave die on the substrate, the surface acoustic wave die including surface acoustic wave resonators arranged as a third filter coupled to the common node.

17. A wireless communication device comprising:
an antenna; and
a radio frequency front end including a multiplexer, the multiplexer including a first acoustic wave filter having a first pass band and second acoustic wave filter having a second pass band with a frequency range above the first pass band, the first acoustic wave filter including bulk acoustic wave resonators having at least a first spurious mode below one or more resonant frequencies of the bulk acoustic wave resonators, the second acoustic wave filter including multilayer piezoelectric substrate surface acoustic wave resonators having at least a second spurious mode above one or more resonant frequencies of the multilayer piezoelectric substrate surface acoustic wave resonators, and the bulk acoustic wave resonators have a substantially constant first gamma in the second pass band, the multilayer piezoelectric substrate surface acoustic wave resonators having a substantially constant second gamma in the first pass band.

18. The wireless communication device of claim 17 wherein the radio frequency front end includes a frequency multiplexing circuit coupled between a common node of the multiplexer and the antenna.

19. The wireless communication device of claim 17 further comprising an antenna switch coupled between a common node of the multiplexer and the antenna.

20. The wireless communication device of claim 17 wherein the bulk acoustic wave resonators have a first gamma of at least 0.9 in the second pass band, and the multilayer piezoelectric substrate surface acoustic wave resonators have a gamma of at least 0.85 in the first pass band.

* * * * *